United States Patent
Kim et al.

(10) Patent No.: US 12,473,491 B2
(45) Date of Patent: Nov. 18, 2025

(54) DISPLAY PANEL, AND ELECTRONIC DEVICE INCLUDING SAME

(71) Applicant: SAMSUNG ELECTRONICS CO., LTD., Suwon-si (KR)

(72) Inventors: Tae-Gon Kim, Suwon-si (KR); Shang Hyeun Park, Suwon-si (KR); Nayoun Won, Suwon-si (KR); Minho Kim, Suwon-si (KR); Seungrim Yang, Suwon-si (KR); Shin Ae Jun, Suwon-si (KR); Yebin Jung, Suwon-si (KR); A Ra Jo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 426 days.

(21) Appl. No.: 18/189,259

(22) Filed: Mar. 24, 2023

(65) Prior Publication Data
US 2023/0303921 A1  Sep. 28, 2023

(30) Foreign Application Priority Data

Mar. 25, 2022 (KR) .................. 10-2022-0037616

(51) Int. Cl.
*C09K 11/62* (2006.01)
*B82Y 20/00* (2011.01)
(Continued)

(52) U.S. Cl.
CPC ............ *C09K 11/621* (2013.01); *C09K 11/02* (2013.01); *C09K 11/0883* (2013.01);
(Continued)

(58) Field of Classification Search
CPC ... C09K 11/621; C09K 11/02; C09K 11/0883; C09K 11/883; C09K 11/08;
(Continued)

(56) References Cited

U.S. PATENT DOCUMENTS 10,927,294 B2   2/2021   Damtew et al.
10,947,403 B2   3/2021   Isonaka et al.
(Continued)

FOREIGN PATENT DOCUMENTS

JP   6972656 B2   12/2005
JP   6547915 B2   4/2020
(Continued)

OTHER PUBLICATIONS

English Abstract of KR 1020170024745 (Publication of KR 1745599 B1).
(Continued)

*Primary Examiner* — James R Greece
*Assistant Examiner* — Jose M Diaz
(74) *Attorney, Agent, or Firm* — CANTOR COLBURN LLP

(57) ABSTRACT

A display panel and an electronic device including the display panel are provided, where the display panel includes a quantum dot composite including a matrix and a plurality of quantum dots and titanium dioxide ($TiO_2$) particles dispersed in the matrix, the plurality of quantum dots include silver and gallium, exhibit an emission peak wavelength of from about 500 nm to about 550 nm, and a full width at half maximum of the emission peak is greater than or equal to about 10 nm and less than or equal to about 50 nm, and where the quantum dot composite has a mole ratio of silver to titanium of greater than or equal to about 0.4:1 and less than or equal to about 15:1, and a mole ratio of gallium to titanium of greater than or equal to about 0.4:1 and less than or equal to about 20:1.

20 Claims, 11 Drawing Sheets

(51) Int. Cl.
   *B82Y 40/00*      (2011.01)
   *C09K 11/02*      (2006.01)
   *C09K 11/08*      (2006.01)
   *C09K 11/88*      (2006.01)
   *G02F 1/13357*    (2006.01)
   *H01L 25/075*     (2006.01)
   *H10K 59/38*      (2023.01)

(52) U.S. Cl.
   CPc ...... *C09K 11/883* (2013.01); *G02F 1/133617* (2013.01); *H10K 59/38* (2023.02); *B82Y 20/00* (2013.01); *B82Y 40/00* (2013.01); *H01L 25/0753* (2013.01)

(58) Field of Classification Search
   CPC ............. C09K 11/025; G02F 1/133617; G02F 2202/36; H10K 59/38; H10K 2102/331; H10K 50/115; B82Y 20/00; B82Y 40/00; H01L 25/0753; H01L 25/167; H10H 20/819; H10H 20/882; H10H 20/8512; H10H 20/8513; Y10S 977/774
   See application file for complete search history.

(56) References Cited

U.S. PATENT DOCUMENTS

| | | |
|---|---|---|
| 11,101,413 B2 | 8/2021 | Torimoto et al. |
| 11,697,764 B2 | 7/2023 | Kim et al. |
| 2021/0139730 A1 | 5/2021 | Isonaka et al. |
| 2023/0043195 A1* | 2/2023 | Kim ............... C09K 11/883 |

FOREIGN PATENT DOCUMENTS

| | | |
|---|---|---|
| JP | 6688403 B2 | 4/2020 |
| JP | 2021096323 A | 6/2021 |
| KR | 1745599 B1 | 6/2017 |
| KR | 20210001995 A | 1/2021 |
| KR | 20210115612 A | 9/2021 |
| KR | 20220017357 A | 2/2022 |

OTHER PUBLICATIONS

English Translation of Office Action dated May 7, 2024 of the corresponding Korean Patent Application No. 10-2022-0037616, 12 pp.

Jong-Hoon Kim, et al., Synthesis of widely emission-tunable Ag—Ga—S and its quaternary derivative quantum dots, Chemical Engineering Journal (2018), 347, 791-797.

Office Action dated May 7, 2024 of the corresponding Korean Patent Application No. 10-2022-0037616, 11 pp.

* cited by examiner

FIG. 1
Pattern Preparation by using a photoresist
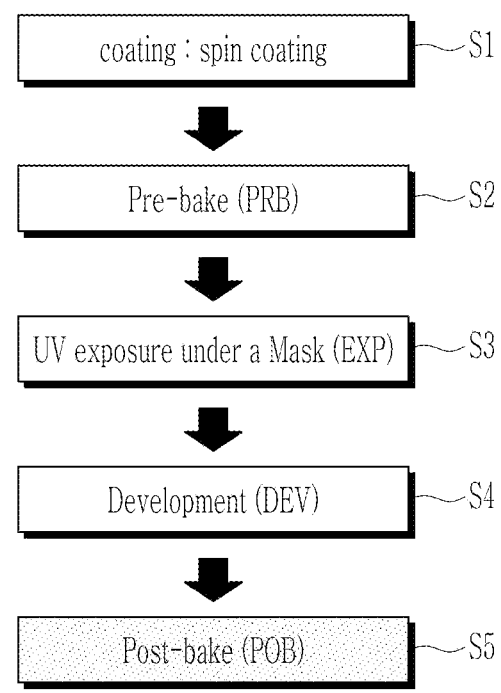
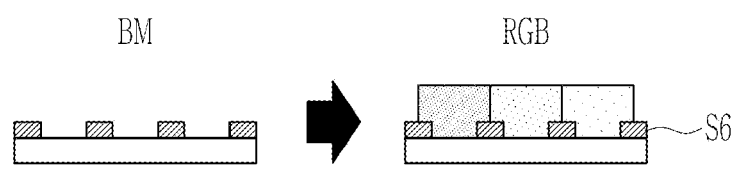
Repeating the Patterning Process three times

DISPLAY PANEL, AND ELECTRONIC DEVICE INCLUDING SAME

CROSS-REFERENCE TO RELATED APPLICATION

This application claims priority to Korean Patent Application No. 10-2022-0037616 filed in the Korean Intellectual Property Office on Mar. 25, 2022, and all the benefits accruing therefrom under 35 U.S.C. § 119, the entire contents of which are incorporated herein by reference.

BACKGROUND

1. Field

A display panel including a plurality of quantum dots and titanium dioxide ($TiO_2$) particles dispersed in a quantum dot composite, and an electronic device including the display panel are disclosed.

2. Description of the Related Art

Quantum dots are nano-sized semiconductor nanocrystal materials that exhibit different aspects, characteristics, or properties than a corresponding bulk material having substantially the same composition. A semiconductor nanocrystal may be structured to emit light of a desired wavelength region by controlling the size and/or composition. The luminous properties of quantum dots may be applied to electronic device, for example, display devices, in the form of a quantum dot composite. There are needs for the development of quantum dots and quantum dot composites that are environmentally friendly and capable of exhibiting improved physical properties when applied to electronic devices.

SUMMARY

An embodiment provides a display panel capable of exhibiting improved luminous properties (e.g., when applied to a device in a form of a quantum dot composite).

Another embodiment provides an electronic device including the display panel.

A display panel according to an embodiment includes a quantum dot composite including a matrix and a plurality of quantum dots and titanium dioxide ($TiO_2$) particles dispersed in the matrix. The plurality of quantum dots include silver and gallium, an emission peak wavelength of the quantum dots is from about 500 nanometers (nm) to about 550 nm, and a full width at half maximum (FWHM) of the emission peak is greater than or equal to about 10 nm and less than or equal to about 50 nm. The quantum dot composite includes a mole ratio of silver to titanium (Ag:Ti) of greater than or equal to about 0.4:1 and less than or equal to about 15:1, and a mole ratio of gallium to titanium (Ga:Ti) of greater than or equal to about 0.4:1 and less than or equal to about 20:1.

A content of the quantum dots in the quantum dot composite may be about 10 weight percent (wt %) to about 40 wt % and a content of the titanium dioxide particles may be about 0.2 wt % to about 7 wt %, based on the total weight of the composite.

The quantum dot may further include sulfur and optionally indium.

The quantum dot may include a core, and a shell disposed on the core, the core includes semiconductor nanocrystals including silver, gallium, and sulfur, and optionally indium, and the shell includes semiconductor nanocrystals including zinc and sulfur.

The core of the quantum dot may include a semiconductor nanocrystal including silver, gallium, sulfur, and indium, and a semiconductor nanocrystal including silver, gallium, and sulfur.

The quantum dot may have an optical density of about 0.8 to about 1.8 for a wavelength of about 450 nm per 1 mg of quantum dots.

The matrix may be prepared from a composition including a polymerizable monomer having a carbon-carbon double bond, an organic solvent, polymer, a thiol compound having at least one thiol group at the terminal end, or a combination thereof.

A display panel according to another embodiment includes a color conversion layer including a plurality of regions including a color conversion region, wherein the color conversion region includes a first color conversion region including quantum dots including silver and gallium, and titanium dioxide particles, and a second color conversion region including quantum dots including indium and phosphorus, and titanium dioxide particles. In the color conversion layer, a mole ratio of silver to titanium (Ag:Ti) is greater than or equal to about 0.1:1 and less than or equal to about 1:1, and a mole ratio of gallium to titanium (Ga:Ti) is greater than or equal to about 0.1:1 and less than or equal to about 1:1.

In the color conversion layer of the display panel, the mole ratio of silver to titanium (Ag:Ti) may be greater than or equal to about 0.1:1 and less than or equal to about 0.75:1, and the mole ratio of gallium to titanium (Ga:Ti) may be greater than or equal to about 0.15:1 and less than or equal to about 0.8:1.

In the color conversion layer of the display panel, the mole ratio Ag:Ti may be greater than or equal to about 0.15:1 and less than or equal to about 0.71:1, and the mole ratio of Ga:Ti may be greater than or equal to about 0.19:1 and less than or equal to about 0.75:1.

The first color conversion region may have an emission peak wavelength of about 500 nm to about 550 nm and the second color conversion region may have an emission peak wavelength of about 600 nm to about 650 nm.

The first color conversion region and the second color conversion region may each include the quantum dots and the titanium dioxide particles in the form of a quantum dot composite dispersed in a polymer matrix. The content of the titanium dioxide particles in the first color conversion region is about 0.2 wt % to about 7 wt % based on the total weight of the composite in the first color conversion region, and a content of the titanium dioxide particles in the second color conversion region is about 0.5 wt % to about 7 wt % based on the total weight of the composite in the second color conversion region.

The content of the titanium dioxide particles in the first color conversion region may be about 0.5 wt % to about 5 wt % based on the total weight of the composite in the first color conversion region, and the content of the titanium dioxide particles in the second color conversion region may be about 1 wt % to about 7 wt % based on the total weight of the composite in the second color conversion region.

The plurality of regions of the color conversion layer may further include a transparent matrix, and a light transmitting region including titanium dioxide particles dispersed in the transparent matrix.

A content of the titanium dioxide particles may be about 1 wt % to about 10 wt % based on the total weight of the transparent matrix and the titanium dioxide particles in the light transmitting region.

The quantum dots included in the first color conversion region may include a core, and a shell disposed on the core, the core includes semiconductor nanocrystals including silver, gallium, and sulfur, and optionally indium, and the shell includes semiconductor nanocrystals including zinc and sulfur, and the quantum dots included in the second color conversion region may include a core, and a shell disposed on the core, the core includes semiconductor nanocrystals including indium and phosphorus, and optionally zinc, and the shell includes semiconductor nanocrystals including zinc and at least one of sulfur or selenium.

The display panel further includes a light emitting panel, the light emitting panel includes a light emitting source configured to emit blue light, a light emitting source configured to emit green light, or a combination thereof.

The light emitting source includes an organic light emitting diode, a micro LED, a mini LED, an LED including a nanorod, or a combination thereof.

The light emitting panel includes a light emitting source configured to emit blue light, and an absorption rate of the color conversion region for the blue light is greater than or equal to about 85%.

An electronic device according to another embodiment includes the display panel.

The display panel according to the embodiment may exhibit improved physical properties, for example, increased blue light absorption rate and narrow full width at half maximum, high luminous efficiency, and high color reproducibility. Moreover, the display panel may utilize various light sources, and may advantageously be used in display devices including a QD color conversion layer, such as, for example, liquid crystal display devices, OLEDs, micro LEDs, nano-LEDs, etc. The display device may advantageously be applied to a TV, a monitor, a mobile device, VR/AR, an electric vehicle display, and the like.

BRIEF DESCRIPTION OF THE DRAWINGS

FIG. 1 is a schematic view illustrating a pattern forming process for manufacturing a display panel according to an embodiment using a photosensitive resin composition (matrix).

DETAILED DESCRIPTION

Figure 2:
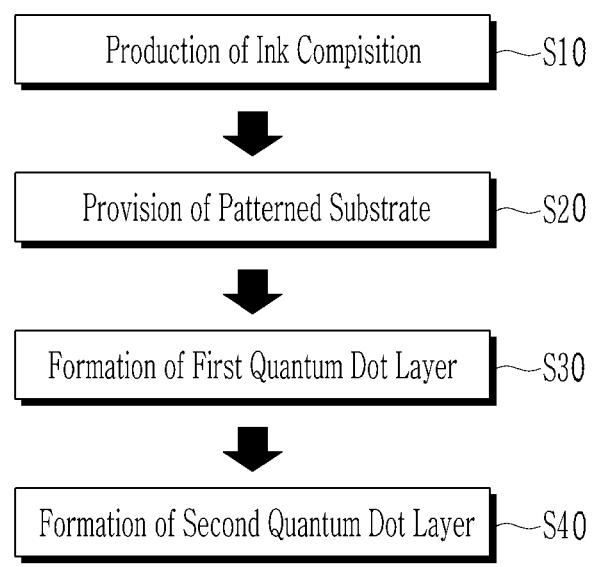
FIG. 2 is a schematic view illustrating a pattern forming process for manufacturing a display panel according to an embodiment using an ink composition.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. In the drawings, the thickness of layers, films, panels, regions, etc., are exaggerated for clarity. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Hereinafter, as used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation, a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "monovalent organic a functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

In addition, when a definition is not otherwise provided below, "hetero" means one including 1 to 3 heteroatoms selected from N, O, S, Si, or P.

As used herein, "alkylene group" is a linear or branched saturated aliphatic hydrocarbon group that optionally includes at least one substituent and has two or more valences. As used herein, "arylene group" may be a functional group that optionally includes at least one substituent, and having two or more valences formed by removal of at least two hydrogens in at least one aromatic ring.

In addition, "aliphatic group" refers to a saturated or unsaturated linear or branched C1 to C30 group consisting of carbon and hydrogen, and "aromatic organic group" includes a C6 to C30 aryl group or a C2 to C30 heteroaryl group, and "alicyclic group" refers to a saturated or unsaturated C3 to C30 cyclic group consisting of carbon and hydrogen.

As used herein, the term "(meth)acrylate" refers to acrylate and/or methacrylate.

As used herein, "light conversion rate" is a ratio of the emission amount (G or R) of the quantum dot composite to the amount of light (B—B') absorbed from the excitation light (e.g., blue light) (B) of the quantum dot composite. In addition, the "light conversion efficiency" is a ratio of the emission amount (G or R) of the quantum dot composite to the emission amount (B) of the excitation light. The total light amount (B) of excitation light is obtained by integrating a PL spectrum, the PL spectrum of the quantum dot composite film is measured to determine a light amount (G or R) in a green or red wavelength emitted from the quantum dot composite film and a light amount (B) of excitation light, and light conversion rate, light conversion efficiency, and blue light absorption rate are obtained by the following equations:

$$A/(B-B')\times 100 = \text{light conversion rate (\%)}$$

$$A/B\times 100 = \text{light conversion efficiency (\%)}$$

$$(B-B')/B\times 100 = \text{blue light absorption rate (\%) of single film}$$

As used herein, "dispersion" refers to dispersion wherein a dispersed phase is solid and a continuous phase includes a liquid. The "dispersion" may include a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm or less than or equal to about 1 μm).

Herein, the term "quantum dots" refer to a nanostructure that exhibits quantum confinement or exciton confinement, such as semiconductor-based nanocrystals (particles), for example, luminescent nanostructure (e.g., capable of emitting light by energy excitation). As used herein, the term "quantum dots" are not limited in shapes thereof, unless otherwise defined.

Here, "a dimension (e.g., size, diameter, thickness, etc.)" may be an average dimension (e.g., size, diameter, thickness, etc.). Here, the "average" may be mean or median. The dimension may be a value obtained by electron microscopic analysis. The dimension may be a value calculated in consideration of the composition and optical properties (e.g., UV absorption wavelength) of the quantum dots.

Herein, "quantum efficiency (or quantum yield)" may be measured in a solution state or in a solid state (in a composite). In an embodiment, quantum efficiency (or quantum yield) is the ratio of photons emitted to photons absorbed by the nanostructure or population thereof. In an embodiment, quantum efficiency may be measured by any method. For example, for fluorescence quantum yield or efficiency, there may be two methods: an absolute method and a relative method. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto.

The quantum efficiency (or quantum yield) may be easily and reproducibly determined using commercially available equipment from Hitachi or Hamamatsu, etc. and referring to manuals provided by, for example, respective equipment manufacturers.

The full width at half maximum (FWHM) and maximum emission (PL: photoluminescence) peak wavelength may be measured, for example, by an emission spectrum obtained by a spectrophotometer such as a fluorescence spectrophotometer or the like.

Herein, the term or language that "does not include cadmium (or other toxic heavy metals or given elements)" means that a concentration of cadmium (or the corresponding heavy metals or given elements) is less than or equal to about 100 ppm, less than or equal to about 50 ppm, less than or equal to about 10 ppm, or near zero. In an embodiment, substantially no cadmium (or its heavy metal) is present, or, if present, in an amount below the detection limit of a given detection means or at an impurity level.

As used herein, the term "optical density" refers to a value when light of a specific wavelength having a constant intensity passes through a solution layer and the luminance intensity becomes the constant intensity. In accordance with the Beer-Lambert law, a value divided by a thickness of the solution layer through which the wavelength has passed. In this specification, the absorbance at 450 nm of a quantum dot solution contained in a cuvette having a 1 cm optical path is defined as optical density.

The semiconductor nanocrystals, also called quantum dots, are crystalline semiconductor materials with nanoscale particle sizes. The quantum dots have a large surface area per unit volume, exhibits a quantum confinement effect, and may exhibit properties different from those of bulk materials having the same composition. The quantum dots absorb light from an excitation source and emit energy corresponding to their bandgap energies. Light emission from the semiconductor nanoparticle may be generated when electrons in an excited state transit from a conduction band to a valence band, for example, by a energy such as an incident light or an applied voltage.

The quantum dots may be applied as light emitting materials in display devices. For example, the quantum dot composite including a plurality of quantum dots dispersed in a polymer matrix or the like may be used as a light conversion layer (e.g., a color conversion layer) that converts a light (e.g., blue light or blue-green light) of a desired wavelength, for example, green light from a light source (e.g., a backlight unit (BLU)) in a display device. That is, unlike the conventional absorption type color filter, a patterned film including the quantum dot composite may be used as an emission type color filter. Since the emission type color filter is disposed in front of the display device, for example, when excitation light, which has linearity and is passed through the liquid crystal layer, the light reaches the emission type color filter, where it is scattered in all directions to realize a wider viewing angle. As a result, light loss due to the absorption type color filter may be avoided.

A display device including a quantum dot-based emission type color filter, for example, a liquid crystal display, may further include a polarizer inside the panel, for example, under the color filter. The display device may further include a yellow-recycling film (YRF) configured to recycle light and/or an excitation light blocker (e.g., a blue-cut filter or a green light cut filter).

The quantum dots having properties currently applicable to electronic devices and the like are mostly cadmium-based quantum dots. However, cadmium causes a serious environment/health problem and thus is one of restricted elements. A cadmium-free quantum dot may be for example a Group III-V-based nanocrystal. However, cadmium-free quantum dots have problems with a low absorption rate of individual quantum dots, so that the quantum dot color filter does not sufficiently absorb blue light from a light irradiation source, and exhibits relatively low light conversion efficiency, and in many instances, a wide full width at half maximum of the emission spectrum.

The absorption of blue light in a quantum dot color filter is basically based on a Beer-Lambert law, that is, $I=I_0 \exp(-\alpha)$, wherein I is an intensity of the absorbed blue light and $I_0$ is an intensity of the blue light of the light emitting source and $\alpha=\varepsilon l c$, wherein $\varepsilon$ is a molar absorption coefficient of the quantum dot, l is the light travel distance, and c is a molar concentration of the quantum dot. Since quantum dots basically absorb blue light, the absorption coefficient (E) of the quantum dots itself becomes the main variable for improving the incident light absorption rate. The light travel distance (l) is a component determined by considering the thickness of the color filter and the optical path increased by the scattering body. In general, since quantum dots are added on a weight basis to implement color conversion pixels in a color filter, the concentration (c) quantum dots are contained per unit weight may also be an important variable in determining the incident light absorption rate. Therefore, one may increase the light absorption coefficient of the quantum dot with the addition of scattering particles or by increasing the pixel thickness. In addition, one may increase the number of quantum dot particles per the same weight, that is, increase the concentration as much as possible to improve the absorption rate of blue light.

InP-based quantum dots are a material that does not contain heavy metals such as cadmium (Cd) or lead (Pb), exhibits high quantum efficiency of over 90%, and may be mass-produced in industry. However, in the case of an InP-based quantum dot, for example, a quantum dot having a core-shell structure having an InP core and a ZnSe shell, absorption of blue light occurs only in the InP core and in a part of ZnSe shell. In addition, when light emission is limited to green light, since the size of the InP core is also limited to a certain range, it is structurally very difficult to increase the absorption coefficient of the InP-based quantum dot.

Pb-perovskite-based material, such as, for example, $CsPbBr_3$, is a material having a high absorption per weight. However, Pb (lead) also contains toxic material, and thus, presents environmental concerns. Meanwhile, a quantum dot including silver (Ag), a Group 13 element, such as, gallium and/or indium, and a chalcogen element, such as, sulfur and/or selenium, has a light absorption per weight equivalent to $CsPbBr_3$, and does not contain toxic substances. Therefore, the quantum dot may be suitable for application in a display product or electronic device.

The present inventors have provided a display panel having a high blue light absorption rate by using a quantum dot composite including a semiconductor nanocrystal including silver, gallium, and optionally indium, and also sulfur, together with a light scatterer, as an embodiment; and an electronic device including a display device. The display panel including the quantum dot composite may have improved light emitting properties, such as, for example, high light conversion efficiency and excellent color reproducibility by including a light emitting source configured to emit blue light due to a high blue light absorption.

While blue light absorption of InP-based quantum dots occurs only in the InP core and in a portion of the ZnSe shell, in the case of a quantum dot including a first semiconductor nanocrystal including silver and a Group 13 element, for example, silver, gallium and/or indium, and sulfur, and a second semiconductor nanocrystal disposed on the first semiconductor nanocrystal and including gallium, and sulfur and/or selenium, absorption of blue light may occur in both the first semiconductor nanocrystal and the second semiconductor nanocrystal, and thus, the blue light absorption rate per unit weight of the quantum dot may be much greater than that of a InP-based quantum dot. In addition, the blue light absorption rate may further be increased by configuring the quantum dots in the form of a composite including the light scatterer.

The present inventors have found that in a quantum dot composite including a matrix, a plurality of quantum dots dispersed in the matrix, and titanium dioxide particles as a light scatterer, where the respective mole ratios of silver to titanium and gallium to titanium, i.e., the mole ratios derived from the plurality of quantum dots and titanium dioxide particles is within a specific range, a blue light absorption rate of the composite is significantly increased, and thus, a front light conversion efficiency of a display panel including the composite or a display device including the display panel may significantly be improved.

In an embodiment, the quantum dots including silver and gallium included in the quantum dot composite are quantum dots that emit green light having an emission peak wavelength from about 500 nm and to about 550 nm, and a full width at half maximum (FWHM) of the emission peak may be greater than or equal to about 10 nm and less than or equal to about 50 nm, e.g., less than 40 nm. In the quantum dot composite, a mole ratio of silver, which is derived from the quantum dots, to titanium, which is derived from titanium dioxide, or Ag:Ti, is greater than or equal to about 0.4:1 and less than or equal to about 15:1, and a mole ratio of gallium, which is also derived from the quantum dots, to titanium, or Ga:Ti, is greater than or equal to about 0.4:1 and less than or equal to about 20:1.

In an embodiment, the mole ratio of silver to titanium (Ag:Ti) in the quantum dot composite may be greater than or equal to about 0.5:1, for example, greater than or equal to about 0.7:1, greater than or equal to about 1.0:1, greater than or equal to about 1.1:1, greater than or equal to about 1.3:1, greater than or equal to about 1.5:1, greater than or equal to about 1.7:1, greater than or equal to about 1.9:1, greater than or equal to about 2.0:1, greater than or equal to about 2.2:1, greater than or equal to about 2.3:1, greater than or equal to about 2.5:1, greater than or equal to about 3:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 6.5:1, greater than or equal to about 7:1, greater than or equal to about 7.5:1, greater than or equal to about 8:1, greater than or equal to about 8.5:1, greater than or equal to about 9:1, greater than or equal to about 9.5:1, greater than or equal to about 10:1, greater than or equal to about 10.5:1, greater than or equal to about 11:1, greater than or equal to about 11.5:1, greater than or equal to about 12:1, greater than or equal to about 12.5:1, greater than or equal to about 13, greater than or equal to about 13.5:1, greater than or equal to about 14:1, or greater than or equal to about 14.5:1, and less than or equal to about 15:1, for example, less than or equal to about 14.5:1, less than or equal to about 14:1, less than or equal to about 13.5:1, less than or equal to about 13:1, less than or equal to about 12.5:1, less than or equal to about 12:1, less than or equal to about 11.5:1, less than or equal to about 11:1, less than or equal to about 10.5:1, less than or equal to about 10:1, less than or equal to about 9.5:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, or less than or equal to about 0.5:1, but is not limited thereto.

In an embodiment, the mole ratio of gallium to titanium (Ga:Ti) in the quantum dot composite may be greater than or equal to about 0.5:1, for example, greater than or equal to about 0.7:1, greater than or equal to about 1.0:1, greater than or equal to about 1.3:1, greater than or equal to about 1.5:1, greater than or equal to about 1.7:1, greater than or equal to about 1.9:1, greater than or equal to about 2.0:1, greater than or equal to about 2.2:1, greater than or equal to about 2.3:1, greater than or equal to about 2.5:1, greater than or equal to about 3:1, greater than or equal to about 3.5:1, greater than or equal to about 4:1, greater than or equal to about 4.5:1, greater than or equal to about 5:1, greater than or equal to about 5.5, greater than or equal to about 6:1, greater than or equal to about 6.5:1, greater than or equal to about 7:1, greater than or equal to about 7.5:1, greater than or equal to about 8:1, greater than or equal to about 8.5:1, greater than or equal to about 9:1, greater than or equal to about 9.5:1, greater than or equal to about 10:1, greater than or equal to about 10.5:1, greater than or equal to about 11:1, greater than or equal to about 11.5:1, greater than or equal to about 12:1, greater than or equal to about 12.5:1, greater than or equal to about 13:1, greater than or equal to about 13.5:1, greater than or equal to about 14:1, greater than or equal to about 14.5:1, greater than or equal to about 15:1, greater than or equal to about 15.5:1, greater than or equal to about 16:1, greater than or equal to about 16.5:1, greater than or equal to about 17:1, greater than or equal to about 17.5:1, greater than or equal to about 18:1, or greater than or equal to about 18.5:1, and less than or equal to about 19:1, for example, less than or equal to about 18.5:1, less than or equal to about 18:1, less than or equal to about 17.5:1, less than or equal to about 17:1, less than or equal to about 16.5:1, less than or equal to about 16:1, less than or equal to about 15.5:1, less than or equal to about 15:1, less than or equal to about 14.5:1, less than or equal to about 14:1, less than or equal to about 13.5:1, less than or equal to about 13:1, less than or equal to about 12.5:1, less than or equal to about 12:1, less than or equal to about 11.5:1, less than or equal to about 11:1, less than or equal to about 10.5:1, less than or equal to about 10:1, less than or equal to about 9.5:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, or less than or equal to about 1:1, but is not limited thereto.

When the mole ratios of the silver element and the gallium element to the titanium element in the quantum dot composite are within the above ranges, the blue light absorption rate of the display panel including the composite may be greater than or equal to about 85%. For example, the blue light absorption rate of the display panel may be greater than or equal to about 86%, for example, greater than or equal to about 87%, greater than or equal to about 88%, greater than or equal to about 89%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, greater than or equal to about 99%, and 100%. Such a high blue light absorption rate is a high absorption rate that cannot be easily obtained from a quantum dot composite including green light emitting InP-based quantum dots of the same weight.

When the composite is irradiated with blue light, for example, having an emission peak wavelength of about 450 nm, an emission peak wavelength emitted from the quantum dot composite may be from about 500 nm to about 550 nm, for example, from about 510 nm to about 550 nm, from about 520 nm to about 545 nm, from about 525 nm to about 545 nm, from about 530 nm to about 545 nm, from about 535 nm to about 545 nm, or about from 535 nm to about 540 nm, but is not limited thereto.

The full width at half maximum (FWHM) of the emission peak of the quantum dot composite may be greater than or equal to about 10 nm and less than or equal to about 50 nm, for example, from about 10 nm to about 45 nm, from about 10 nm to about 40 nm, from about 10 nm to about 35 nm, from about 10 nm to about 30 nm, from about 15 nm to about 35 nm, from about 15 nm to about 30 nm, from about 15 nm to about 30 nm, or from about 15 nm to about 25 nm, but is not limited thereto.

In order for the quantum dot composite in the display panel according to the embodiment to have the above range of mole ratios as described above, the respective content of the quantum dots including silver and gallium and the titanium dioxide particles in the composite may be appropriately adjusted. For example, based on the total weight of the quantum dot composite including the quantum dots and titanium dioxide particles, the content of the quantum dots is about 10 wt % to about 40 wt % and the content of the titanium dioxide particles is about 0.2 wt % to about 7 wt %. By including the quantum dots including silver and gallium and titanium dioxide particles within the stated range of weight percents, the mole ratios of silver to titanium and the mole ratio of gallium to titanium in a quantum dot composite, and a matrix that disperses the quantum dots may be adjusted within the above-mentioned ranges.

In an embodiment, the content of the quantum dots in the quantum dot composite may be about 10 wt % to about 35 weight, for example, about 10 wt % to about 30 wt %, about 10 wt % to about 28 wt %, about 10 wt % to about 25 wt %, about 10 wt % to about 23 wt %, about 10 wt % to about 22 wt %, about 10 wt % to about 20 wt %, about 10 wt % to about 18 wt %, about 10 wt % to about 17 wt %, or about 10 wt % to about 15 wt %, but is not limited thereto.

In an embodiment, the content of the titanium dioxide particles in the quantum dot composite may be about 0.5 wt % to about 5.5 weight, for example, about 1 wt % to about 5 wt %, about 1 wt % to about 4.8 wt %, about 1 wt % to about 4.5 wt %, about 1 wt % to about 4 wt %, about 1 wt % to about 3.5 wt %, about 1 wt % to about 3 wt %, about 1 wt % to about 2.5 wt %, about 1 wt % to about 2.2 wt %, about 1 wt % to about 2 wt %, about 1 wt % to about 2 wt %, or about 1 wt % to about 1.5 wt %, but is not limited thereto.

In the quantum dot composite, excluding the total content of the quantum dots and titanium dioxide particles, the composite may include the compositional or structural content of the matrix as well as the initiator or other additives dispersed in the matrix.

In an embodiment, the quantum dots may further include sulfur (S) in addition to silver and gallium. In this case, the quantum dots may have a core-shell structure that includes a core including semiconductor nanocrystals including silver, gallium, and sulfur, and optionally indium, and a shell disposed on the core and including semiconductor nanocrystals zinc, and sulfur and/or selenium.

In an embodiment, the core may include a first semiconductor nanocrystal containing silver, gallium, indium, and sulfur, and a second semiconductor nanocrystal containing silver, gallium, and sulfur.

In an embodiment, the semiconductor nanocrystals included in the shell may include zinc and selenium and/or sulfur, for example, zinc and sulfur. For example, the semiconductor nanocrystals included in the shell may include ZnSe, ZnSeS, ZnS, or a combination thereof.

A size (or average size) of the quantum dots may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, or greater than or equal to about 10.5 nm. The size (or average size) of the quantum dots may be less than or equal to about 50 nm, less than or equal to about 48 nm, less than or equal to about 46 nm, less than or equal to about 44 nm, less than or equal to about 42 nm, less than or equal to about 40 nm, less than or equal to about 35 nm, less than or equal to about 30 nm, less than or equal to about 25 nm, less than or equal to about 20 nm, less than or equal to about 18 nm, less than or equal to about 16 nm, less than or equal to about 14 nm, less than or equal to about 12 nm, less than or equal to about 11 nm, less than or equal to about 10 nm, less than or equal to about 8 nm, less than or equal to about 6 nm, or less than or equal to about 4 nm. As used herein, the size of the particles may be a particle diameter. If the quantum dots or the first semiconductor nanocrystal are generally not spherical, the particle size may be a diameter calculated by converting a two-dimensional area confirmed by transmission electron microscopy into a circle. The size may be a value calculated from the composition and emission wavelength of the quantum dots.

As described above, the quantum dot may be a green light emitting quantum dot having an emission peak wavelength of about 500 nm to about 550 nm, and the quantum yield of the quantum dot may be greater than or equal to about 50%. The quantum yield may be an absolute quantum yield. The quantum yield may be, for example, greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%. The quantum yield may be less than or equal to 100%, less than or equal to 99.5%, less than or equal to 99%, less than or equal to 98%, or less than or equal to 97%.

The optical density per unit weight of the quantum dots may be easily measured by using an optical density-measuring instrument which is well known in the art. For example, the quantum dots containing a metal including silver and gallium, and/or indium, and a nonmetal including sulfur, but not including cadmium may be prepared as described herein or commercially purchased. The quantum dots are dispersed in toluene, and the dispersion is added to a cuvette having an optical path of a specific length, for example, about 1 cm, and measured as described herein with respect to optical density according to a wavelength. Subsequently, after removing the solvent from the measured dispersion, a weight of the quantum dots as described herein is measured and used to convert the measured optical density to a weight per mg of the quantum dot to obtain optical density per unit weight of the quantum dots.

In an embodiment, the quantum dot may have an optical density per 1 milligram (mg) for a wavelength of 460 nm in a range of about 0.8 to about 1.8, for example, about 0.9 to about 1.7, about 1.0 to about 1.7, about 1.0 to about 1.6, about 1.1 to about 1.8, about 1.1 to about 1.7, about 1.2 to about 1.8, about 1.2 to about 1.7, about 1.3 to about 1.8, about 1.3 to about 1.7, about 1.3 to about 1.6, about 1.4 to about 1.8, about 1.4 to about 1.7, about 1.4 to about 1.6, and the like, but is not limited thereto. The quantum dot may be a quantum dot emitting green light having an emission peak from about 500 nm to about 550 nm.

The quantum dots may be obtained by reacting precursor compounds such as a silver precursor, a gallium precursor, and an indium precursor, a sulfur precursor, a selenium precursor, and a zinc precursor, if present, depending on the composition, in a solution containing an organic ligand and an organic solvent at a predetermined reaction temperature (e.g., about 20° C. to about 300° C., about 80° C. to about 295° C., about 120° C. to about 290° C., or about 200° C. to about 280° C.) and separating the same.

For example, the quantum dots may be prepared by a method including obtaining the aforementioned first semiconductor nanocrystals; preparing a reaction medium including a first precursor and an organic ligand in an organic solvent; heating the reaction medium to a first temperature; adding the semiconductor nanocrystals and a second precursor to the reaction medium to obtain a reaction mixture; and heating the reaction medium to a second temperature and reacting the same for a first time period to form nanoparticles, wherein one of the first precursor and the second precursor is a gallium precursor and the other is a sulfur precursor The first temperature may be greater than or equal to about 120° C. and less than or equal to about 280° C., and the second temperature may be greater than or equal to about 180° C. and less than or equal to about 380° C.

In an embodiment, the first precursor may be a gallium precursor and the second precursor may be a sulfur precursor. In an embodiment, the first precursor may be a sulfur precursor and the second precursor may be a gallium precursor.

The method for producing the quantum dots may further include: preparing an additional reaction medium including an organic ligand and a zinc precursor in an organic solvent; adding the formed quantum dots and a chalcogen precursor and reacting them while heating the reaction medium to a reaction temperature to provide an outer layer including zinc chalcogenide on the surface of the quantum dots. The chalcogen precursor includes a sulfur precursor, a selenium precursor, or a combination thereof. The reaction temperature may refer to the descriptions of the second temperature.

The content of the first semiconductor nanocrystal is the same as described above. The first semiconductor nanocrystal may include silver, gallium, and sulfur, and may optionally further include indium. The method for producing the first semiconductor nanocrystal is not particularly limited and may be appropriately selected. In an embodiment, the first semiconductor nanocrystals may be obtained by reacting the required precursors depending on the composition, such as a silver precursor, an indium precursor, a gallium precursor, and a sulfur precursor in a solution including an organic ligand and an organic solvent at a predetermined reaction temperature (e.g., about 20° C. to about 300° C., about 80° C. to about 295° C., about 120° C. to about 290° C., or about 200° C. to about 280° C.) and separating the same. For separation and recovery, a method to be described later may be referred to.

The second temperature may be higher than the first temperature. A difference between the first temperature and the second temperature may be greater than or equal to about 10° C., greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The difference between the first temperature and the second temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., or less than or equal to about 20° C.

The first temperature may be greater than or equal to about 120° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 280° C., less than or equal to about 275° C., less than or equal to about 270° C., less than or equal to about 265° C., less than or equal to about 260° C., less than or equal to about 255° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., or less than or equal to about 150° C.

The second temperature may be greater than or equal to about 180° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 330° C., greater than or equal to about 335° C., greater than or equal to about 340° C., or greater than or equal to about 345° C. The second temperature may be less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C.

In an embodiment, the first time period may be in a range of about 10 minutes to about 3 hours, about 20 minutes to about 150 minutes, about 30 minutes to about 100 minutes, or a combination thereof. The first time period may be selected in consideration of the types of precursors, the reaction temperature, the desired composition of the final particles, and the like.

In an embodiment, the second reaction temperature may be within a relatively high temperature range (e.g., greater than or equal to about 280° C., about 285° C. to about 340° C., or about 290° C. to about 330° C.), and the first time period may be greater than or equal to about 10 minutes, greater than or equal to about 15 minutes, greater than or equal to about 20 minutes, or greater than or equal to about 25 minutes and less than or equal to about 2 hours, less than or equal to about 90 minutes, less than or equal to about 80 minutes, less than or equal to about 70 minutes, less than or equal to about 60 minutes, less than or equal to about 50 minutes, less than or equal to about 45 minutes, less than or equal to about 40 minutes, or less than or equal to about 35 minutes.

In an embodiment, the second reaction temperature may be within a relatively low temperature range (e.g., less than about 290° C.) and the first reaction time may be greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, greater than or equal to about 60 minutes, greater than or equal to about 65 minutes, greater than or equal to about 70 minutes, greater than or equal to about 75 minutes, or greater than or equal to about 80 minutes.

The type of the silver precursor is not particularly limited and may be appropriately selected. The silver precursor may be a silver powder, an alkylated silver compound, silver alkoxide, silver carboxylate, silver acetylacetonate, silver nitrate, silver sulfate, silver halide, silver cyanide, silver hydroxide, silver oxide, silver peroxide seeds, silver carbonate, or a combination thereof. The silver precursor may include silver nitrate, silver acetate, silver acetylacetonate, silver chloride, silver bromide, silver iodide, or a combination thereof.

The type of the gallium precursor is not particularly limited and may be appropriately selected. The gallium precursor may include a gallium powder, a gallium alkylide compound, gallium alkoxide, gallium carboxylate, gallium nitrate, gallium perchlorate, gallium sulfate, gallium acetylacetonate, gallium halide, gallium cyanide, gallium hydroxide, gallium oxide, gallium peroxide, gallium carbonate, gallium chloride, gallium bromide, gallium iodide, or a combination thereof. The gallium precursor may include gallium chloride, gallium iodide, gallium bromide, gallium acetate, gallium acetylacetonate, gallium oleate, gallium palmitate, gallium stearate, gallium myristate, gallium hydroxide, or a combination thereof.

The type of the indium precursor is not particularly limited and may be appropriately selected. The indium precursor may include an indium powder, an alkylated indium compound, indium alkoxide, indium carboxylate, indium nitrate, indium perchlorate, indium sulfate, indium acetylacetonate, indium halide, indium cyanide, indium oxide, indium peroxide, indium carbonate, indium acetate, or a combination thereof.

The indium precursor may include indium carboxylate such as indium oleate and indium myristate, indium acetate, indium hydroxide, indium chloride, indium bromide, and indium iodide.

The type of the sulfur precursor is not particularly limited and may be appropriately selected. The sulfur precursor may be an organic solvent dispersion or reaction product of sulfur (e.g., sulfur-oleyl amine (S-oleylamine), sulfur-dodecylamine (S-dodecylamine), sulfur-octadecene (S-ODE), trioctylphosphine-sulfide (S-TOP), tributylphosphine-sulfide (S-TBP), triphenylphosphine-sulfide (S-TPP), sulfur-trioctylamine (S-TOA), trimethylsilylallyl sulfide, bis(trimethylsilyl) sulfide, mercapto propyl silane, ammonium sulfide, sodium sulfide, a C1-30 thiol compound (e.g., α-toluenethiol, octanethiol, dodecanethiol, octadecanethiol, etc.), an isothiocyanate compound (e.g., cyclohenlisothiocyanate cyclohexyl isothiocyanate), alkylenetrithiocarbonate (e.g., ethylene trithiocarbonate), allyl mercaptan, thiourea compound (e.g., thiourea, diallylthiourea, or phenylthiourea), or a combination thereof.

The selenium precursor, if present, may include trioctylphosphine selenide (Se-TOP), tributylphosphine selenide (Se-TBP), triphenylphosphine selenide (Se-TPP), or a combination thereof.

The type of the zinc precursor is not particularly limited and may be appropriately selected. For example, the zinc precursor may be a Zn metal powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, etc.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein, R and R' are each independently substituted or unsubstituted C1 to C40 (or C3 to C24) aliphatic hydrocarbon (e.g., alkyl group, alkenyl group alkynyl group), or a substituted or unsubstituted C6 to C40 (or C6 to C24) aromatic hydrocarbon (e.g., C6 to C20 aryl group)), or a combination thereof. The organic ligand may be bound to the surface of the prepared quantum dot. The organic ligand may be methane thiol, ethane thiol, propane thiol, butane thiol, pentane thiol, hexane thiol, heptane thiol, octane thiol, nonanethiol, decanethiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), and the like phosphine; phosphine oxide such as substituted or unsubstituted methyl phosphine oxide (e.g., trimethyl phosphine oxide, methyldiphenyl phosphineoxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, substituted or unsubstituted octylphosphineoxide (e.g., trioctylphosphineoxide (TOPO), etc.; diphenyl phosphine, a triphenyl phosphine compound, or an oxide compound thereof; C5 to C20 alkylphosphinic acid or C5 to C20 alkyl phosphonic acid such as phosphonic acid, hexylphosphonic acid, octylphosphonic acid, dodecanephosphinic acid, tetradecanephosphinic acid, hexadecanephosphinic acid, octadecanephosphinic acid, etc.; and the like, but is not limited thereto. The organic ligand may be used alone or as a mixture of two or more.

The organic solvent may be selected from an amine solvent, a nitrogen-containing heterocyclic compound such as pyridine; C6 to C40 aliphatic hydrocarbon (e.g., alkane, alkene, alkyne, etc.) such as hexadecane, octadecane, octadecene, or squalane; C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide, and the like; C12 to C22 aromatic ether such as phenyl ether, or benzyl ether, or a combination thereof. The amine solvent may be a compound having one or more (e.g., two or three) C1-50, C2-45, C3-40, C4-35, C5-30, C6-25, C7-20, C8-15, or C6-22 aliphatic hydrocarbon groups (alkyl group, alkenyl group, or an alkynyl group). In an embodiment, the amine solvent may be a C6-22 primary amine such as hexadecylamine and oleylamine; secondary amines of C6-22 such as dioctylamine; C6-22 tertiary amines such as trioctylamine; or a combination thereof.

The content of the organic ligand and each precursor in the reaction medium may be appropriately selected in consideration of the type of solvent, the type of the organic ligand and each precursor, and the size and composition of a desired quantum dot. A molar ratio between the respective precursors may be appropriately selected in consideration of a desired molar ratio in the quantum dot, reactivity between the respective precursors, and the like. The method of adding each of the precursors is not particularly limited, and may be divided and injected at least once, or as portions, e.g., at least 2 times, and up to 10 times.

Each of the precursors may be injected simultaneously or sequentially to perform the reaction. The reaction may be carried out in an inert gas atmosphere or in air or in a vacuum state but is not limited thereto.

A nonsolvent may be added to the final reaction solution after completion of the reaction (e.g., the organic ligand is coordinated) to promote the precipitations of nanoparticles or nanocrystals, which may be separated (e.g., by centrifugation). The nonsolvent may be a polar solvent that is miscible with the solvent used in the reaction but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof.

The separation may be performed by centrifugation, precipitation, chromatography, or distillation. Separated quantum dots may be washed by adding to a washing solvent as needed. The washing solvent is not particularly limited, and a solvent having a solubility parameter similar to that of the organic solvent or ligand may be used. The nonsolvent or washing solvent may be alcohol; alkane solvents such as hexane, heptane, or octane; aromatic solvents such as chloroform; toluene, or benzene; or a combination thereof, but is not limited thereto.

The prepared quantum dots may be dispersed in a dispersion solvent. The quantum dots may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof.

The shape of the quantum dots is not particularly limited, and may include, for example, spherical, polyhedral, pyramidal, multi-pod, cubic, nanotubes, nanowires, nanofibers, nanosheets, or a combination thereof, but is not limited thereto.

The quantum dots may include the aforementioned organic ligand and/or organic solvent on the surface. The organic ligand and/or the organic solvent may be bound to the surface of the nanoparticles.

The display panel according to the embodiment may include the quantum dots as described above in the form of a quantum dot composite in which the quantum dots are dispersed together with titanium dioxide particles in a matrix. For example, the quantum dot composite may be disposed in the color conversion region of the display panel in the form of a composite including a matrix and quantum dots dispersed in the matrix. The quantum dot composite may have an increased level of blue light absorption rate (e.g., improved excitation light absorption rate) and improved optical properties (e.g., increased luminous efficiency and a narrowed full width at half maximum) and may emit light of a desired wavelength (e.g., green light having an emission peak wavelength of about 500 nm to about 550 nm). The quantum dot composite may have a sheet form or the composite may be in the form of a patterned film.

The quantum dot composite may be produced from a quantum dot composition (e.g., in a solid state through polymerization, etc.) in which the aforementioned quantum dots are dispersed in a dispersant including a polymerizable monomer to form a matrix, an organic solvent, a polymer, a thiol compound having at least one thiol group at the terminal end, or a combination thereof.

The quantum dot composition may include (e.g., a plurality of) the aforementioned quantum dot(s); optionally a monomer, a dispersant, or a combination thereof; and (organic) solvents and/or liquid vehicles. The dispersant may disperse the quantum dots. The dispersant may include a carboxylic acid group-containing compound (monomer or polymer). The composition may further include a (photo) polymerizable monomer including a carbon-carbon double bond, and optionally a (thermal or photo) initiator. The composition may be a photosensitive composition.

Since the details for the quantum dots in the composition are the same as those of the quantum dots according to the embodiment described above, detailed descriptions thereof will be omitted.

The content of the quantum dots in the composition may be appropriately adjusted, so that in the form of a quantum dot composite disposed in a color conversion region in a color conversion layer of a display panel according to an embodiment, a mole ratio of the silver to titanium contained therein may be greater than or equal to about 0.4:1 and less than or equal to about 15:1 and a mole ratio of the gallium to titanium may be greater than or equal to about 0.4:1 and less than or equal to about 20:1.

To this end, the content of quantum dots containing silver and gallium in the composition (or composite), and having an emission peak wavelength between about 500 nm and about 550 nm and a half width at half maximum of the emission peak of about 10 nm to about 50 nm may be about 10 wt % to about 40 wt %, for example, greater than or equal to about 11 wt %, greater than or equal to about 15 wt %, greater than or equal to about 17 wt %, greater than or equal to about 20 wt %, greater than or equal to about 25 wt %, greater than or equal to about 30 wt %, greater than or equal to about 35 wt %, or greater than or equal to about 37 wt %, based on the total weight of the quantum dot composite produced from the composition, or the total weight of solids in the composition, and less than or equal to about 40 wt %, for example, less than or equal to about 35 wt %, less than or equal to about 30 wt %, less than or equal to about 25 wt %, less than or equal to about 20 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, or less than or equal to about 11 wt % based on the total weight of the composite produced from the composition or the total weight of solids in the composition.

Herein, (e.g., when the quantum dot composition includes an organic solvent), the content based on the total solids in the composition may correspond to the content of the corresponding component in the quantum dot composite. For example, when the quantum dot composition is a solvent-free system (not including an organic solvent), the content range in the composition may correspond to the content range in the composite.

In the composition according to an embodiment, the dispersant may contribute to achieving an acceptable dispersibility of quantum dots and/or titanium dioxide in the matrix, and thus, the quantum dot composite. In an embodiment, the dispersant may include an organic compound (e.g., a monomer or a polymer) (e.g., containing a carboxylic acid group), for example a binder polymer. The dispersant or binder polymer may be an insulating polymer.

The organic compound having the carboxylic acid group may include
- a combination of monomers including a first monomer having a carboxylic acid group and a carbon-carbon double bond, a second monomer having a carbon-carbon double bond and a hydrophobic moiety and not having a carboxylic acid group, and optionally a third monomer having a carbon-carbon double bond and a hydrophilic moiety and not having a carboxylic acid group, or a copolymer thereof;
- a multiple aromatic ring-containing polymer (hereinafter, cardo binder) having a backbone in which two aromatic rings in a main chain are bonded to quaternary carbon atoms that are constituent atoms of other cyclic moieties, and having a carboxylic acid group (—COOH); or
- a combination thereof.

The dispersant may include the aforementioned first monomer, second monomer, and optionally, the third monomer.

The content of the dispersant (or binder polymer) in the composition may be greater than or equal to about 0.5 wt %, for example, greater than or equal to about 1 wt %, greater than or equal to about 5 wt %, greater than or equal to about 10 wt %, greater than or equal to about 15 wt %, greater than or equal to about 20 wt %, greater than or equal to about 30 wt %, greater than or equal to about 40 wt %, or greater than or equal to about 50 wt % based on the total weight or total solid content of the composition or composite, but is not limited thereto. The content of the dispersant (or binder polymer) may be less than or equal to about 60 wt %, less than or equal to about 50 wt %, less than or equal to about 40 wt %, less than or equal to about 35 wt %, less than or equal to about 33 wt %, less than or equal to about 30 wt %, less than or equal to about 20 wt %, or less than or equal to about 10 wt % based on the total weight or total solids of the composition or composite. The content of the dispersant (or binder polymer) may be about 0.5 wt % to about 55 wt % based on the total weight or total solids of the composition or composite.

The composition may include a polymerizable (e.g., photopolymerizable) monomer including the carbon-carbon double bond. The monomer may include a (e.g., photopolymerizable) (meth)acrylic monomer. The monomer may be a precursor for the insulating polymer.

The content of the monomer may be greater than or equal to about 0.5 wt %, for example, greater than or equal to about 1 wt %, greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt % based on the total weight or total solids of the composition or composite. The content of the photopolymerizable monomer may be less than or equal to about 60 wt %, less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on the total weight or total solids of the composition or composite.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, the content of the initiator may be appropriately adjusted considering types and contents of the polymerizable monomers. In an embodiment, the content of the initiator may be greater than or equal to about 0.01 wt %, for example, greater than or equal to about 1 wt %, greater than or equal to about 5 wt %, and/or greater than or equal to about and/or 10 wt %, and for example, less than or equal to about 9 wt %, less than or equal to about 8 wt %, less than or equal to about 7 wt %, less than or equal to about 6 wt %, or less than or equal to about 5 wt % based on the total weight of the composition (or the total weight of the solid content), but is not limited thereto.

The composition may further include a (multi- or mono-functional) thiol compound having at least one thiol group at the terminal end, or a combination thereof.

In an embodiment, the content of the titanium dioxide ($TiO_2$) particles in the quantum dot composite may be greater than or equal to about 0.2 wt % and less than or equal to about 7 wt %, for example, greater than or equal to about 0.5 wt %, greater than or equal to about 1 wt %, greater than or equal to about 1.5 wt %, greater than or equal to about 2.0 wt %, greater than or equal to about 2.5 wt %, greater than or equal to about 3 wt %, greater than or equal to about 3.5 wt %, greater than or equal to about 4 wt %, greater than or equal to about 4.5 wt %, greater than or equal to about 5 wt %, greater than or equal to about 5.5 wt %, greater than or equal to about 6 wt %, or greater than or equal to about 6.5 wt %, and less than or equal to about 6.5 wt %, less than or equal to about 6 wt %, less than or equal to about 5.5 wt %, less than or equal to about 5 wt %, less than or equal to about 4.5 wt %, less than or equal to about 4 wt %, less than or equal to about 3.5 wt %, less than or equal to about 3 wt %, less than or equal to about 2.5 wt %, less than or equal to about 2 wt %, less than or equal to about 1.5 wt %, less than or equal to about 1 wt %, or less than or equal to about 0.5 wt % based on the total weight of the composite.

As described above, in an embodiment, a quantum dot composite is prepared by using a quantum dot including silver and gallium having a higher blue light absorption rate than that of a conventional InP-based quantum dot. Also, because the blue light absorption rate of the quantum dot is increased based on the same composite weight, a content of the titanium dioxide particles as a scatterer may relatively further be reduced. Accordingly, a content of the quantum dot relative to that of the titanium dioxide particles may further be increased, and thereby, increasing the blue light absorption rate of the quantum dot composite. Accordingly, a display panel having a much higher blue light absorption rate and much improved luminous properties may be manufactured or achieved.

The titanium dioxide ($TiO_2$) particles exists in the form of particulates in the matrix, and the diameter of the particulates is not particularly limited and may be appropriately selected. An average diameter of the titanium dioxide particles may be greater than or equal to about 100 nm, for example greater than or equal to about 150 nm, or greater than or equal to about 200 nm and less than or equal to about 1000 nm, or less than or equal to about 800 nm, less than or equal to about 500 nm, less than or equal to about 400 nm, or less than or equal to about 300 nm. For example, greater than or equal to 150 nm and less than or equal to 400 nm or 300 nm The (multi) thiol compound may be a dithiol compound, a trithiol compound, a tetrathiol compound, or a combination thereof. For example, the thiol compound may be glycoldi-3-mercaptopropionate, glycoldimercapto acetate, trimethylolpropanetris(3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the (multi) thiol compound may be less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on the total weight of the composition (or a total weight of solids in the composition). The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt % based on the total weight of the composition (or a total weight of solids in the composition).

The composition may further include an organic solvent (or liquid vehicle, hereinafter referred to as a solvent) or may not include an organic solvent. The type of useable solvent is not particularly limited. Non-limiting examples of the solvent or liquid vehicle may be ethyl 3-ethoxy propionate; ethylene glycols such as ethylene glycol, diethylene glycol, polyethylene glycol, and the like; glycol ethers such as ethylene glycol monomethylether, ethylene glycol monoethylether, diethylene glycol monomethylether, ethylene glycol diethylether, diethylene glycol dimethylether, and the like; glycol etheracetates such as ethylene glycol acetate, ethylene glycol monoethyletheracetate, diethylene glycol monoethyletheracetate, diethylene glycol monobutyletheracetate, and the like; propylene glycols such as propylene glycol, and the like; propylene glycol ethers such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol etheracetates such as propylene glycol monomethyl ether acetate, dipropylene glycol monoethyletheracetate, and the like; amides such as N-methylpyrrolidone, dimethyl formamide, dimethyl acetamide, and the like; ketones such as dimethylsulfoxide; methylethylketone (MEK), methylisobutylketone (MIBK), cyclohexanone, and the like; petroleums such as solvent naphtha, and the like; esters such as ethyl acetate, butyl acetate, ethyl lactate, and the like; ethers such as tetrahydrofuran, diethyl ether, dipropyl ether, dibutyl ether, and the like, chloroform, C1 to C40 aliphatic hydrocarbon (e.g., alkane, alkene, or alkyne), a halogen- (e.g., chlorine-) substituted C1 to C40 aliphatic hydrocarbon (e.g., dichloroethane, trichloromethane, and the like), C6 to C40 aromatic hydrocarbon (e.g., toluene, xylene, and the like), a halogen- (e.g., chlorine-) substituted C6 to C40 aromatic hydrocarbon, or a combination thereof, but are not limited thereto.

The types and contents of the organic solvent may be appropriately determined by considering the aforementioned main components (i.e., the quantum dots, the dispersant, the polymerizable monomer, the initiator, and if used, the thiol compound) and types and contents of additives which is described later. The composition may include a solvent in a residual amount except for a desired content of the (non-volatile) solid.

The composition (e.g., inkjet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs. As described above, the quantum dot composite may exhibit a higher blue light absorption rate even if the composite has a smaller amount of quantum dots and/or titanium dioxide particles compared to the quantum dot composite that includes conventional InP-based quantum dots, based on the same weight. Accordingly, the process for making the quantum dot using ink-jet printing may be facilitated due to a viscosity of the composition.

When used in an inkjet process, the composition may be discharged to a substrate at room temperature, and may be heated, for example, to form a quantum dot-polymer composite film or a pattern thereof. The ink composition, while having the aforementioned viscosity, may have a surface tension at about 23° C. of greater than or equal to about 21 millinewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m. The ink composition may have a surface tension of less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, less than or equal to about 32 mN/m, less than or equal to about 31 mN/m, less than or equal to about 30 mN/m, less than or equal to about 29 mN/m, or less than or equal to about 28 mN/m.

In an embodiment, the composition may further include, for example, an additive included in the composition for photoresist or the ink composition. The additive may include a light diffusing agent, a leveling agent, a coupling agent, and the like. For specific details, the additives may be those described in US 2017/0052444.

The composition may be prepared by a method that includes preparing a quantum dot dispersion including the aforementioned quantum dots, dispersant, and solvent; and mixing an initiator; a polymerizable monomer (e.g., an acrylic monomer); and optionally a thiol compound; titanium dioxide ($TiO_2$); and optionally the aforementioned additives in the form of a quantum dot dispersion. Each of the aforementioned components may be mixed sequentially or simultaneously, and the order is not particularly limited.

The composition may be used to provide a pattern of a quantum dot composite (e.g., a quantum dot-polymer composite). The composition may provide a quantum dot-polymer composite by (e.g., radical) polymerization. The composition for preparing a quantum dot composite according to an embodiment may be a quantum dot-containing photoresist composition applicable to a photolithography method. The composition according to an embodiment may be an ink composition capable of providing a pattern by a printing method (e.g., a droplet discharging method such as inkjet printing). In the case of the ink composition, a solvent-free composition that does not include a solvent may be used.

In the quantum dot composite, the role of the titanium dioxide particles is as a scatterer or a light diffusing agent, so that the light absorbed from the excitation light remains in the quantum dot composite for a relatively longer period of time, and therefore, there may be more opportunity to be absorbed by the quantum dots.

The (polymer) matrix may include a crosslinked polymer and/or a linear polymer. The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit.

The matrix may include the aforementioned dispersant (e.g., a carboxylic acid group-containing monomer or polymer), a polymerization product of a polymerizable monomer including at least one carbon-carbon double bond, for example 2 or more, 3 or more, 4 or more, or 5 or more, such as an insulating polymer, and optionally a polymerization product between the polymerizable monomer and thiol compounds having at least one, for example, two or more thiol groups at the terminal end.

In an embodiment, the polymer matrix may include a crosslinked polymer, a linear polymer, or a combination thereof. The crosslinked polymer may include a thiolene resin, a crosslinked poly(meth)acrylate, or a combination thereof. In an embodiment, the crosslinked polymer may be a polymerization product of the aforementioned polymerizable monomer, and optionally a (multi) thiol compound. Details for the quantum dots, dispersants, polymerizable monomers, and descriptions of the (multi) thiol compound are the same as described above.

When the quantum dot composite according to an embodiment is applied to a display device with a light emitting panel including a blue light source with an emission peak of about 430 nm to about 470 nm as described below, the emission peak wavelength may be between about 500 nm and about 550 nm, the emission peak may have a full width at half maximum (FWHM) of about 10 nm to about 50 nm, and the blue light absorption rate may be greater than or equal to about 85%. Accordingly, the quantum dot composite according to an embodiment may be advantageously applied to a display panel and the like of a display device.

The display panel may include a color conversion layer including a plurality of regions including a color conversion region, and the quantum dot composite may be disposed in the color conversion region in the color conversion layer. In an embodiment, the color conversion layer may further include a partition wall defining a plurality of regions.

In an embodiment, the display panel may further include a light emitting panel including a light emitting source configured to emit blue light, a light emitting source configured to emit green light, or a combination thereof, and the color conversion layer may convert an emission spectrum of excitation light emitted from the light emitting panel. For example, the color conversion layer including a quantum dot composite in the color conversion region may absorb the blue light, convert the blue light into green light having an emission peak wavelength of about 500 nm to about 550 nm that is then emitted from the color conversion layer. At this time, the blue light absorption rate of the color conversion layer including the quantum dot composite may be greater than or equal to about 85%, for example, greater than or equal to about 86%, greater than or equal to about 87%, greater than or equal to about 88%, greater than or equal to about 89%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, greater than or equal to about 99%, or greater than or equal to 100%. Due to the improved high blue light absorption rate as described above, photoluminescence characteristics of the display panel including the color conversion layer may be further improved. For example, a display device to be described later including the display panel is ITU-R Recommendation BT. 2020 (Rec. 2020) standard color gamut may be greater than or equal to about 90%.

In an embodiment, the color conversion layer may be in a form of a patterned film.

In an embodiment, the color conversion region of the color conversion layer includes at least one first color conversion region configured to emit a first light following absorption of the excitation light, and the first color conversion region may include the quantum dot composite. The color conversion layer may be a patterned film of a quantum dot composite.

The color conversion region may further include a (e.g., one or more) second color conversion region configured to emit a second light different from the first light (e.g., by absorption of excitation light), and the second color conversion region may include a quantum dot composite according to an embodiment. For example, the second color conversion region may emit a second light having an emission peak wavelength from about 600 nm to about 650 nm and may include a color conversion member configured to emit the second light.

The color conversion member may also include a matrix, titanium dioxide particles dispersed in the matrix, and a quantum dot as a color conversion material or a phosphor other than the quantum dot included in the color conversion member and emitting the second light. In an embodiment, the color conversion member of the second color conversion region may include a quantum dot as the color conversion material, wherein this quantum dot may include quantum dots emitting light of a different wavelength (e.g., different color) from that of the quantum dot composite in the first color conversion region.

In an embodiment, a plurality of quantum dots included in the color conversion member may be InP-based red light emitting quantum dots. In case of the InP-based quantum dots, green light emitting quantum dots exhibit a very low blue light absorption rate due to the limited core size, but red light emitting quantum dots have a relatively excellent blue light absorption rate due to the larger core size. Accordingly, in the display panel according to an embodiment, the quantum dots included in the color conversion member disposed in the second color conversion region may be conventional InP-based quantum dots or quantum dots including different elements.

In addition, the plurality of regions of the display panel may further include a light transmitting region configured to transmit blue light, green light, or a combination thereof, which is emitted from the light emitting panel. The light transmitting region may not include the aforementioned quantum dot composite nor the color conversion member but titanium dioxide particles alone in a transparent matrix.

In an embodiment, the display panel includes a second color conversion region emitting light of a different emission spectrum from that of the first color conversion region and/or the light transmitting region in addition to the first color conversion region. When the mole ratio of silver to titanium (Ag:Ti) and the mole ratio of gallium to titanium (Ga:Ti) are within the above-identified specific ranges throughout the display panel, the display panel exhibits a significantly increased blue light absorption rate, and thereby, exhibits significantly improved luminous efficiency. For example, in the entire display panel, the mole ratio Ag:Ti is greater than or equal to about 0.1:1 and less than or equal to about 1:1, and the mole ratio of Ga:Ti is greater than or equal to about 0.1:1 and less than or equal to about 1:1. For example, in the entire display panel, the mole ratio of Ag:Ti may be greater than or equal to 0.1:1 and less than or equal to about 0.75:1, for example, greater than or equal to about 0.15:1 and less than or equal to about 0.71:1, and the mole ratio of Ga:Ti may be greater than or equal to about 0.15:1 and less than or equal to about 0.8:1, for example, greater than or equal to about 0.19:1 and less than or equal to about 0.75:1.

In the entire display panel according to an embodiment, in order to make the mole ratio of Ag:Ti and the mole ratio of Ga:Ti within the ranges, each content of titanium dioxide in the first color conversion region, the second color conversion region, and the light transmitting region may be advantageously controlled.

For example, based on the total weight of the color conversion member in the second color conversion region, the content of the titanium dioxide particles may be about 0.5 wt % to about 7 wt %. For example, based on the total weight of the color conversion member in the second color conversion region, the content of titanium dioxide particles may be about 1 wt % to about 6.5 wt %, about 1 wt % to about 6 wt %, about 1 wt % to about 5.5 wt %, about 1.5 wt % to about 5.5 wt %, about 1.5 wt % to about 5 wt %, about 1.5 wt % to about 4.5 wt %, about 1.5 wt % to about 4 wt %, about 1 wt % to about 4 wt %, about 1 wt % to about 3.5 wt %, about 1.5 wt % to about 3.5 wt %, about 1 wt % to about 3 wt %, about 1 wt % to about 2.5 wt %, about 1.5 wt % to about 2.5 wt %, or about 1 wt % to about 2 wt %, and it may be appropriately adjusted within these ranges.

For example, the content of titanium dioxide in the light transmitting region may be about 1 wt % to about 10 wt % based on the total weight of the transparent matrix and the titanium dioxide particles in the light transmitting region. For example, based on the total weight of the transparent matrix and the titanium dioxide particles in the light transmitting region, the content of titanium dioxide particles may be about 1 wt % to about 9.5 wt %, about 1 wt % to about 9 wt %, about 1 wt % to about 8.5 wt %, about 1 wt % to about 8 wt %, about 1.5 wt % to about 8 wt %, about 1.5 wt % to about 7.5 wt %, about 1.5 wt % to about 7 wt %, about 1.5 wt % to about 6.5 wt %, about 1.5 wt % to about 6 wt %, about 2 wt % to about 6 wt %, about 2 wt % to about 5.5 wt %, about 2 wt % to about 5 wt %, about 2 wt % to about 4.5 wt %, about 2 wt % to about 4 wt %, and it may be appropriately adjusted within these ranges.

The content of titanium dioxide particles in the first color conversion region is the same as described above.

A content mole ratio of each element in the display panel according to an embodiment, for example, may be measured by physically scraping off a predetermined area including each color conversion region, for example the first color conversion region, second color conversion region, and light transmitting region in the display panel, which is substantially a predetermined volume of a solid, and grinding the scrapings into a powder, dissolving the powder in various types of acid, for example, nitric acid, bromic acid, hydrofluoric acid, and the like, to prepare a solution, and performing an ICP-AES analysis of the solution. Herein, in the solution, a polymer constituting a matrix included in each color conversion region and the light transmitting region, titanium dioxide particles dispersed with the quantum dots in the matrix, and various other components may be detected together, but the titanium elements may be derived from the titanium dioxide particles alone, and other elements such as silver, gallium, and the like, when the first color conversion region or the second color conversion region includes quantum dots including silver and gallium, may also derived from the quantum dots alone in the second color conversion region. Accordingly, each mole ratio of silver and gallium elements derived from the quantum dots relative to Ti elements derived from the titanium dioxide particles may be measured regardless of other components in the display panel. Accordingly, each mole ratio of silver to titanium and gallium to titanium may be quantitatively analyzed.

As described above, in the display panel according to the embodiment, the mole ratio of silver to titanium and the mole ratio of gallium to titanium is within a specific range to provide the stated improvement in optical characteristics to the display panel according to an embodiment.

The color conversion layer (or the patterned film of the quantum dot composite) of the display panel according to an embodiment may be produced using a photoresist composition. The method for preparing the color conversion layer may include forming a film of the composition for preparing the quantum dot composite on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot-polymer composite (S4). The obtained pattern may be, optionally, post-baked (POB) to improve crack resistance and solvent resistance of the pattern (S5).

Referring to FIG. 1, the aforementioned composition is applied to a predetermined thickness on a substrate using an appropriate method such as spin coating or slit coating to form a film. The formed film may be optionally subjected to a pre-baking (PRB). The pre-baking may be performed by selecting an appropriate condition from known conditions of a temperature, time, an atmosphere, and the like.

The formed (or optionally prebaked) film is exposed to light having a predetermined wavelength under a mask having a predetermined pattern. A wavelength and intensity of the light may be selected considering types and contents of the photoinitiator, types and contents of the quantum dots, and the like.

The exposed film is treated with an alkali developing solution (e.g., dipping or spraying) to dissolve an unexposed region and obtain a desired pattern. The obtained pattern may be, optionally, post-baked (POB) to improve crack resistance and solvent resistance of the pattern, for example, at a temperature of about 150° C. to about 230° C. for a predetermined time (e.g., greater than or equal to about 10 minutes or greater than or equal to about 20 minutes).

The color conversion panel may optionally further include a partition wall (e.g., a black matrix (BM), a bank, or a combination thereof) (S6) that defines each color conversion region of the color conversion layer (e.g., a color conversion structure). See, FIG. 1.

When the color conversion panel or the patterned film of the quantum dot composite has a plurality of repeating regions (that is, color conversion regions), each repeating region may be formed by preparing a plurality of compositions including quantum dots (e.g., red light emitting quantum dots, green quantum dots, or optionally, blue quantum dots) having desired luminous properties (emission peak wavelength and the like) and repeating the aforementioned pattern-forming process as many times as necessary (e.g., 2 times or more, or 3 times or more) for each composition, resultantly obtaining a quantum dot-polymer composite having a desired pattern. For example, the quantum dot-polymer composite may have a pattern of at least two repeating color regions (e.g., RGB color regions). This quantum dot-polymer composite pattern may be used as a photoluminescence type color filter in a display device.

The color conversion panel or the patterned film of the quantum dot composite may be produced using an ink composition configured to form a pattern in an inkjet manner. Referring to FIG. 2, such a method may include preparing an ink composition according to an embodiment (S10), providing a substrate (e.g., with pixel areas patterned by electrodes and optionally banks, etc.) (S20), depositing an ink composition on the substrate (or the pixel area) to form, for example, a first quantum dot layer (or first region) (S30); and depositing an ink composition on the substrate (or the pixel area) to form, for example, a second quantum dot layer (or second region) (S40). The forming of the first quantum dot layer and the forming of the second quantum dot layer may be simultaneously or sequentially carried out.

The depositing of the ink composition may be performed using an appropriate liquid crystal discharger, for example an inkjet or nozzle printing system having an ink storage and at least one print head. The deposited ink composition may provide a first or second quantum dot layer through the solvent removal and polymerization by the heating. The method may provide a highly precise quantum dot-polymer composite film or patterned film for a short time by the simple method.

The aforementioned display panel including the quantum dot composite (pattern) may be included in an electronic device. Such a device may include, but are not limited to, a display device, a light emitting diode (LED), an organic light emitting diode (OLED), a quantum dot LED, a sensor, a solar cell, an imaging sensor, a photodetector, or a liquid crystal display device. The aforementioned display panel including the quantum dot composite may be included in an electronic apparatus. Such an electronic apparatus may include, but is not limited to, a portable terminal device, a monitor, a note PC, a television, an electric sign board, a camera, a car, and the like. The electronic apparatus may be a portable terminal device including a display device (or a light emitting device) including quantum dots, a monitor, a note PC, or a television. The electronic apparatus may be a camera or a mobile terminal device including an image sensor including quantum dots. The electronic apparatus may be a camera or a vehicle including a photodetector including quantum dots.

Hereinafter, a display panel according to an embodiment will be described in more detail with reference to the drawings.

Figure 3:
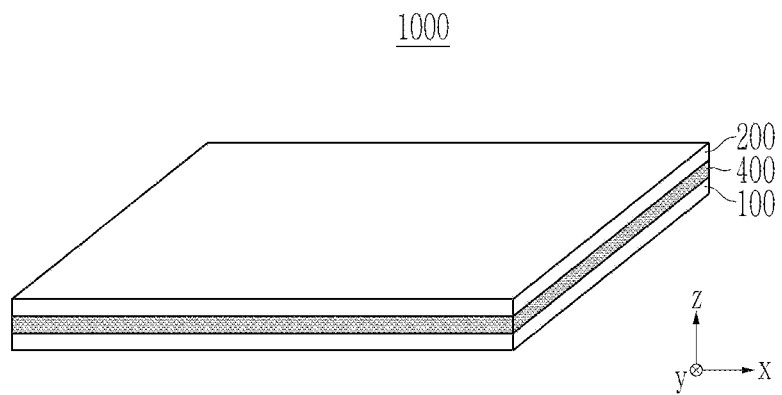
FIG. 3 is a perspective view illustrating an example of a display panel according to an embodiment.
Figure 4:
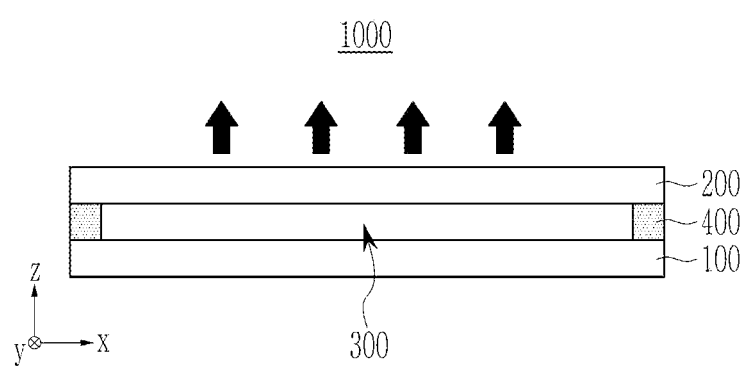
FIG. 4 is a cross-sectional view of the display panel of FIG. 3.

Referring to FIGS. 3 and 4, a display panel 1000 according to an embodiment includes a light emitting panel 100, a color conversion layer 200, a light transmitting layer 300 between the light emitting panel 100 and the color conversion layer 200, and a binder 400 bonding the light emitting panel 100 and the color conversion layer 200. The light emitting panel 100 and the color conversion layer 200 may face each other with the light transmitting layer 300 therebetween, and the color conversion layer 200 may be disposed in a direction in which light is emitted from the light emitting panel 100. The binder 400 may be disposed along the edges of the light emitting panel 100 and the color conversion layer 200, and may be, for example, a sealant.

In FIGS. 3 and 4, the light transmitting layer 300 is disposed between the light emitting panel 100 and the color conversion layer 200, and the binder 400 is disposed along the edges of the light emitting panel 100 and the color conversion layer 200. However, the light transmitting layer 300 and the binder 400 may be omitted and are not necessarily included. That is, the light emitting panel 100 and the color conversion layer 200 may be directly coupled without interposing the light transmitting layer 300.

Figure 5:
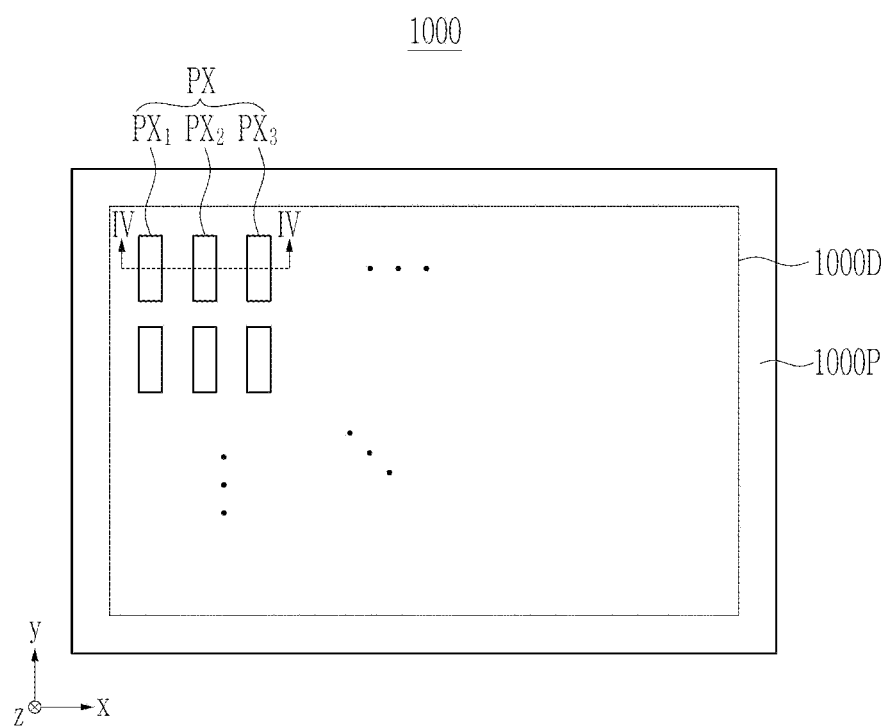
FIG. 5 is a plan view illustrating an example of a pixel arrangement of the display panel of FIG. 3.

Referring to FIG. 5, a display panel 1000 according to an embodiment includes a display area 1000D for displaying an image and a non-display area 1000P disposed around the display area 1000D and in which the binding element 400 is disposed.

The display area 1000D may include a plurality of pixels PXs arranged along a row (e.g., x direction) and/or a column (e.g., y direction), and each pixel PX may include a plurality of subpixels $PX_1$, $PX_2$, and $PX_3$ displaying different colors.

Herein, as an example, a configuration in which three subpixels $PX_1$, $PX_2$, and $PX_3$ constitute one pixel PX is illustrated, but the configuration is not limited thereto. An additional subpixel such as a white subpixel may be further included, and one or more subpixel displaying the same color may be included. The plurality of pixels PXs may be arranged in, for example, a Bayer matrix, a PenTile matrix, and/or a diamond matrix, but is not limited thereto.

Each of the subpixels $PX_1$, $PX_2$, and $PX_3$ may be configured to display a color of three primary colors or a combination of three primary colors, for example, red, green, blue, or a combination thereof. For example, the first subpixel $PX_1$ may be configured to display green, the second subpixel $PX_2$ may be configured to display red, and the third subpixel $PX_3$ may be configured to display blue.

In the drawing, an example in which all subpixels have the same size is illustrated, but the present disclosure is not limited thereto. At least one of the subpixels may be larger or smaller than the other subpixels. In the drawing, an example in which all subpixels have the same shape is illustrated, but the present disclosure is not limited thereto. At least one of the subpixels may have a different shape from other subpixels.

Figure 6:
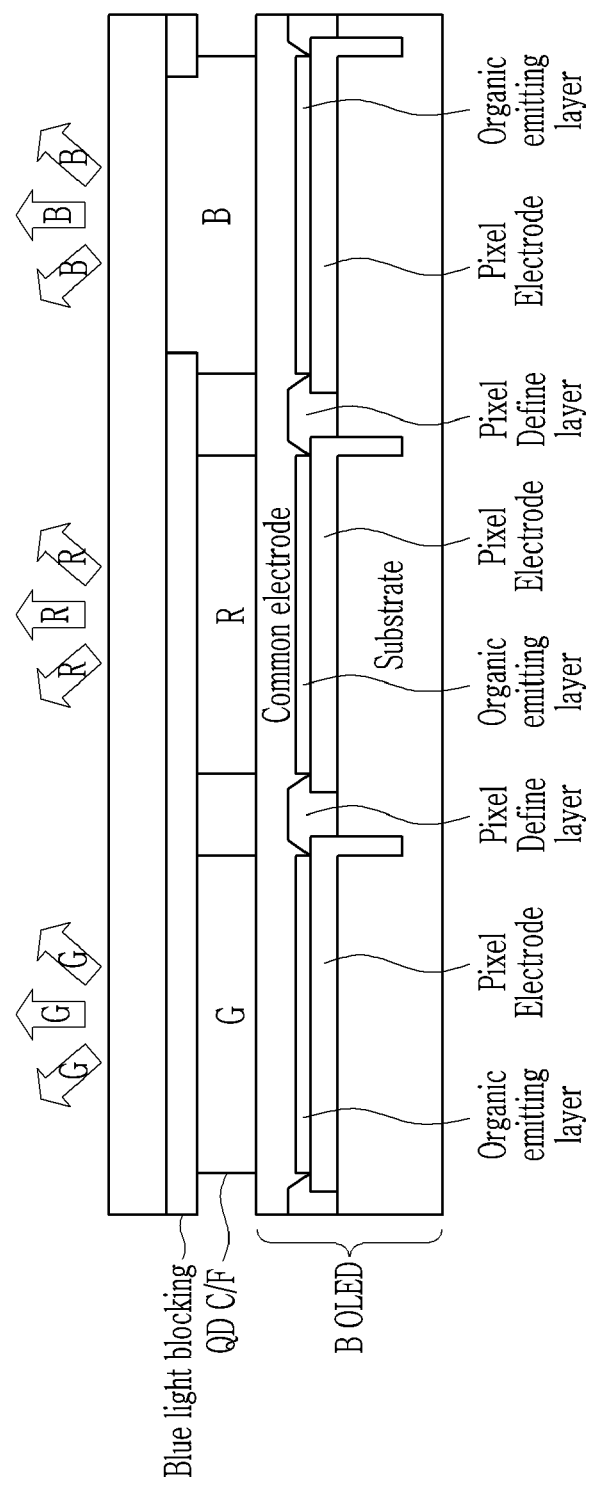
FIG. 6 is a cross-sectional representation of the display panel of FIG. 5 taken along line IV-IV.

FIG. 6 is a schematic cross-sectional representation of a device (or a display panel) according to embodiments. Referring to FIG. 6, the light source (or light emitting panel) includes an organic light emitting diode that emits blue light and optionally blue light and green light (B OLED). The organic light emitting diode may include at least two-pixel electrodes formed on the substrate, a pixel define layer formed between the adjacent pixel electrodes, an organic light emitting layer formed on each pixel electrode, and a common electrode layer formed on the organic light emitting layer. A thin film transistor and a substrate may be disposed under the organic light emitting diode. The pixel area of the B OLED may be disposed to correspond to first, second, and third regions to be described later.

A stacked structure including the quantum dot composite (e.g., a first color conversion region including the green quantum dot composite and a second color conversion region including red quantum dot composite) pattern and substrate may be disposed on the light source. The blue light emitted from the light source enters the first color conversion region and second color conversion region and emits green light and red light, respectively. The blue light emitted from the light source may pass through the third region. An element (first optical filter or excitation light blocking layer) configured to block the excitation light may be disposed between the quantum dot composite layers R and G and the substrate, as needed. When the excitation light includes blue light and green light, a green light blocking filter may be added to the third region. The first optical filter or the excitation light blocking layer is described in more detail below.

The device may be produced by separately producing the aforementioned color conversion layer and an LED or OLED emitting blue light and optionally green light and then combining them. Alternatively, the device may be produced by directly forming the quantum dot composite pattern on the LED or OLED.

The substrate may be a substrate including an insulating material. The substrate may include glass; various polymers such as a polyester of polyethylene terephthalate (PET), polyethylene naphthalate (PEN), and the like, polycarbonate, and polyacrylate; polysiloxane (e.g. PDMS); an inorganic material such as $Al_2O_3$ or ZnO; or a combination thereof, but is not limited thereto. A thickness of the substrate may be appropriately selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light blocking properties are stacked sequentially.

Between two adjacent pixel electrodes, a pixel define layer (PDL) overlapped with a terminal end of the pixel electrode to divide the pixel electrode into a pixel unit. The pixel define layer is an insulating layer which may electrically block the at least two-pixel electrodes.

The pixel define layer covers a portion of the upper surface of the pixel electrode, and the remaining region of the pixel electrode where is not covered by the pixel define layer may provide an opening. An organic light emitting layer that will be described later may be formed on the region defined by the opening.

The organic light emitting layer defines each pixel area by the aforementioned pixel electrode and the pixel define layer. In other words, one pixel area may be defined as an area where is formed with one organic light emitting unit layer which is contacted with one pixel electrode divided by the pixel define layer. In the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to UV region. Each of the first to the third pixel areas of the organic light emitting layer may emit third light. In an embodiment, the third light may be a light having the highest energy in the visible light region, for example, may be blue light (and optionally green light). When all pixel areas of the organic light emitting layer are designed to emit the same light, each pixel area of the organic light emitting layer may be all formed of the same or similar materials or may show the same or similar properties. Thus, it may greatly relieve a process difficulty of forming the organic light emitting layer, and thus the display device may be easily applied for the large scale/large area process. However, the organic light emitting layer according to an embodiment is not necessarily limited thereto, but the organic light emitting layer may be designed to emit at least two different wavelengths of light.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the stacked structure and the lower substrate, and in the stacked structure, the light emitting layer may be disposed to face the liquid crystal layer. The display device may further include a polarizing plate between the liquid crystal layer and the light emitting layer. The light source may further include LED and if necessary, a light guide plate.

Figure 7:
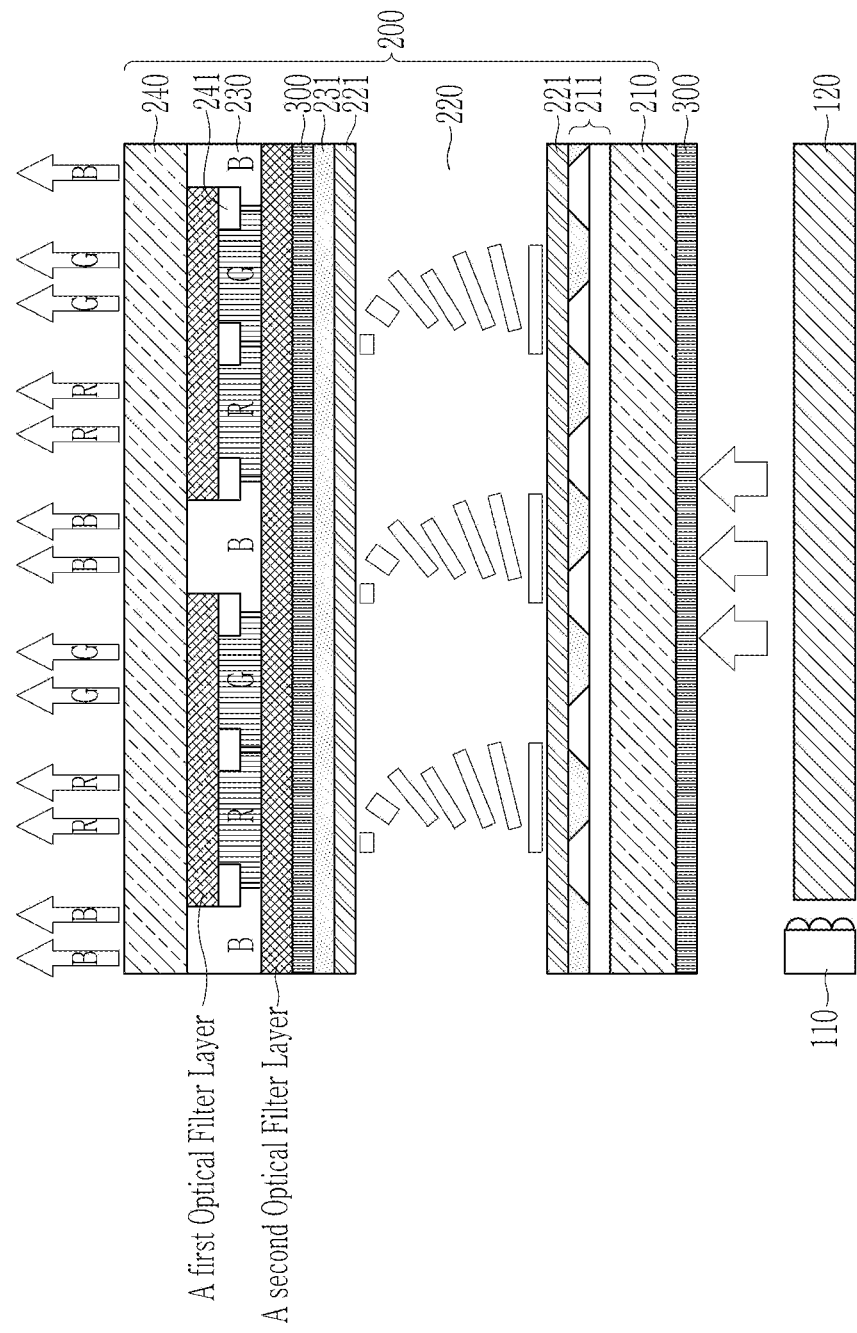
FIG. 7 is a cross-sectional representation of a display panel according to another embodiment.

Non-limiting examples of the display device (e.g., a liquid crystal display device) according to an embodiment are illustrated with a reference to a drawing. FIG. 7 is a schematic cross-sectional representation showing a liquid crystal display according to an embodiment. Referring to FIG. 7, the display device of an embodiment includes a liquid crystal panel 200, a polarizing plate 300 disposed under the liquid crystal panel 200, and a backlight unit (110, 120) disposed under the polarizing plate 300.

The liquid crystal panel 200 includes a lower substrate 210, a stacked structure, and a liquid crystal layer 220 disposed between the stack structure and the lower substrate. The stacked structure includes a transparent substrate 240 and a photoluminescent layer 230 including a pattern of a quantum dot-polymer composite.

The lower substrate 210 referred to as an array substrate may be a transparent insulating material substrate. The substrate 210 is the same as described above. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

A liquid crystal layer 220 is provided on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizing plate 300 is provided under the lower substrate. Materials and structures of the polarizing plate 300 are known and are not particularly limited. A backlight unit (e.g., emitting blue light) may be disposed under the polarizing plate 300. An upper optical element or the polarizing plate 300 may be provided between the liquid crystal layer 220 and the transparent substrate 240 but is not limited thereto. For example, the upper polarizing plate may be disposed between the liquid crystal layer 220 and the photoluminescent layer 230. The polarizing plate may be any polarizer that can be used in a liquid crystal display device. The polarizing plate may be TAC (triacetyl cellulose) having a thickness of less than or equal to about 200 μm but is not limited thereto. In another embodiment, the upper optical element may be a coating that controls a refractive index without a polarization function.

The backlight unit includes a light source 110. The light source may emit blue light or white light. The light source may include, but is not limited to, a blue LED, a white LED, a white OLED, or a combination thereof.

The backlight unit may further include a light guide plate 120. In an embodiment, the backlight unit may be of an edge type. For example, the backlight unit may include a reflector (not shown), a light guide plate (not shown) provided on the reflector and providing a planar light source with the liquid crystal panel 200, and/or at least one optical sheet (not shown) on the light guide plate, for example, a diffusion plate, a prism sheet, and the like, but is not limited thereto. The backlight unit may not include a light guide plate. In an embodiment, the backlight unit may be direct lighting. For example, the backlight unit may have a reflector (not shown) and a plurality of fluorescent lamps on the reflector at regular intervals, or may have an LED operating substrate on which a plurality of light emitting diodes, a diffusion plate thereon, and optionally at least one optical sheet may be disposed. Details (e.g., each component of a light emitting diode, a fluorescent lamp, a light guide plate, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a grid shape. The photoluminescent layer 230 is provided in the opening of the black matrix 241 and has a photoluminescent layer 230 having a quantum dot-polymer composite pattern including a first region (R) configured to emit first light (e.g., red light), a second region (G) configured to emit second light (e.g., green light), and a third region (B) configured to emit/transmit, for example, blue light. If needed, the photoluminescent layer may further include at least one fourth region. The fourth region may include a quantum dot that emits different color from light emitted from the first to third regions (e.g., cyan, magenta, and yellow light).

In the photoluminescent layer 230, regions forming the pattern may be repeated corresponding to pixel areas formed on the lower substrate. A transparent common electrode 231 may be provided on the photoluminescent color filter layer 230.

The third region (B) configured to emit/transmit blue light may be a transparent color filter that does not change the emission spectrum of the light source. In this case, blue light emitted from the backlight unit may enter in a polarized state and may be emitted through the polarizing plate and the liquid crystal layer as it is. If needed, the third region may include a quantum dot emitting blue light.

As described above, if desired, the display device or light emitting device according to an embodiment may further include an excitation light blocking layer or a first optical filter layer (hereinafter, referred to as a first optical filter layer). The first optical filter layer may be disposed between the bottom surface of the first region (R) and the second region (G) and the substrate (e.g., the upper substrate 240), or on the upper surface of the substrate. The first optical filter layer may be a sheet having an opening in a portion corresponding to a pixel area (third region) displaying blue, and thus may be formed in portions corresponding to the first and second regions. That is, the first optical filter layer may be integrally formed at positions other than the position overlapped with the third region but is not limited thereto. Two or more first optical filter layers may be spaced apart from each other at positions overlapped with the first and second regions, and optionally, the third region. When the light source includes a green light emitting element, a green light blocking layer may be disposed on the third region.

The first optical filter layer may block light having, for example, a predetermined wavelength region in the visible light region and may transmit light in the other wavelength regions, and for example, it may block blue light (or green light) and may transmit light except the blue light (or green light). The first optical filter layer may transmit, for example, green light, red light, and/or yellow light which is a mixed color thereof. The first optical filter layer may transmit blue light and block green light and may be disposed on the blue light emitting pixel.

The first optical filter layer may substantially block excitation light and transmit light in a desired wavelength region. The transmittance of the first optical filter layer for the light in a desired wavelength range may be greater than or equal to about 70%, greater than or equal to about 80%, greater than or equal to about 90%, or even 100%.

The first optical filter layer configured to selectively transmit red light may be disposed at a position overlapped with the red light emitting region, and the first optical filter layer configured to selectively transmit green light may be disposed at a position overlapped with the green light emitting region. The first optical filter layer may include at least one of a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). When the light source emits blue and green mixed light, the first optical filter may further include a third region that selectively transmits blue light and blocks green light.

The first region may be disposed at a position overlapped with the green light emitting region. The second region may be disposed at a position overlapped with the red light emitting region. The third region may be disposed at a position overlapped with the blue light emitting region.

The first region, the second region, and, optionally, the third region may be optically isolated. A first optical filter layer may contribute to improvement of color purity of the display device.

The display device may further include a second optical filter layer (e.g., recycling layer of red/green light or yellow light) that is disposed between the photoluminescent layer and the liquid crystal layer (e.g., between the photoluminescent layer and the upper polarizer), transmits at least a portion of the third light (excitation light), and reflects at least a portion of the first light and/or the second light. The first light may be green light, the second light may be red light, and the third light may be blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer 140 and reflected. The reflected green light and red light may pass through the first and second regions and to be emitted to the outside of the display device 10.

The second optical filter layer or the first optical filter layer may be formed as an integrated layer having a relatively planar surface.

The first optical filter layer may include a polymer thin film including a dye and/or a pigment absorbing light in a wavelength which is to be blocked. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic-inorganic composite, or a combination thereof.

The first optical filter layer or the second optical filter layer may include a plurality of layers having different refractive indexes. It may be formed by stacking two layers having different refractive indexes. For example, the first/second optical filter layer may be formed by alternately stacking a material having a high refractive index and a material having a low refractive index.

FIGS. 8 to 11 are schematic cross-sectional representations showing examples of light emitting devices, respectively.

Figure 8:
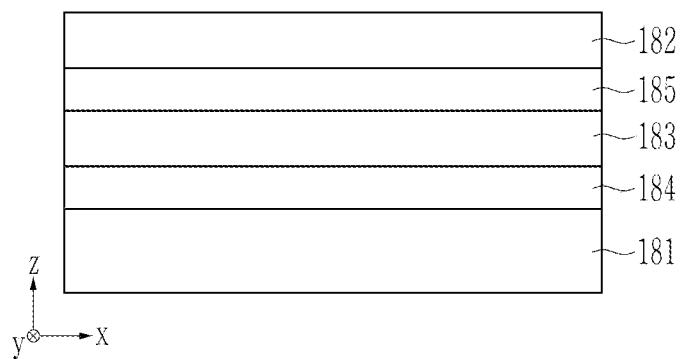
FIGS. 8 to 11 are cross-sectional representations each showing examples of light emitting devices.

Referring to FIG. 8, the light emitting device 180 includes a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may be disposed to face each other along a thickness direction (for example, z direction), and any one of the first electrode 181 and the second electrode 182 may be an anode and the other may be a cathode. The first electrode 181 may be a light transmitting electrode, a transflective electrode, or a reflecting electrode, and the second electrode 182 may be a light transmitting electrode or a transflective electrode. The light transmitting electrode or transflective electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AITO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflecting electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitting body capable of emitting light having a first emission spectrum. The first emission spectrum may belong to a relatively short wavelength region among the visible light wavelength spectrum, and may be, for example, a blue emission spectrum. The maximum emission wavelength of the blue emission blue emission spectrum may belong to a wavelength range of greater than or equal to about 400 nanometers (nm) and less than about 500 nm, and may belong to a wavelength range of about 410 nm to about 490 nm, about 420 nm to about 480 nm, or about 430 nm to about 470 nm within the above range. The light emitting body may be one or two or more.

For example, the light emitting layer 183 may include a host material and a dopant material.

For example, the light emitting layer 183 may include a phosphorescent material, a fluorescent material, or a combination thereof.

For example, the light emitting body may include an organic light emitting body, and the organic light emitting body may be a low molecular weight compound, a polymer, or a combination thereof. When the light emitting body includes an organic light emitting body, the light emitting device 180 may be an organic light emitting diode.

For example, the light emitting body may include an inorganic light emitting body, and the inorganic light emitting body may be an inorganic semiconductor, quantum dot, perovskite, or a combination thereof. When the light emitting body includes an inorganic light emitting body, the light emitting device 180 may be a quantum dot light emitting diode, a perovskite light emitting diode, or a micro light emitting diode.

In an embodiment, the light emitting body may include an inorganic light emitting body, and each of the plurality of light emitting devices 180 may be a micro light emitting diode.

The auxiliary layers 184 and 185 may be disposed between the first electrode 181 and the light emitting layer 183 and between the second electrode 182 and the light emitting layer 183, respectively, and may be a charge auxiliary layer to control injection and/or mobility of charges, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. At least one of the auxiliary layers 184 and 185 may be omitted.

The light emitting devices disposed in each of the subpixels $PX_1$, $PX_2$, and $PX_3$ may be the same or different from each other. The light emitting devices disposed in each of the subpixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, about 420 nm to about 480 nm, or about 430 nm to about 470 nm. The light emitting devices disposed in each of the subpixels $PX_1$, $PX_2$, and $PX_3$ may be separated by a pixel defining layer (not shown).

Figure 9:
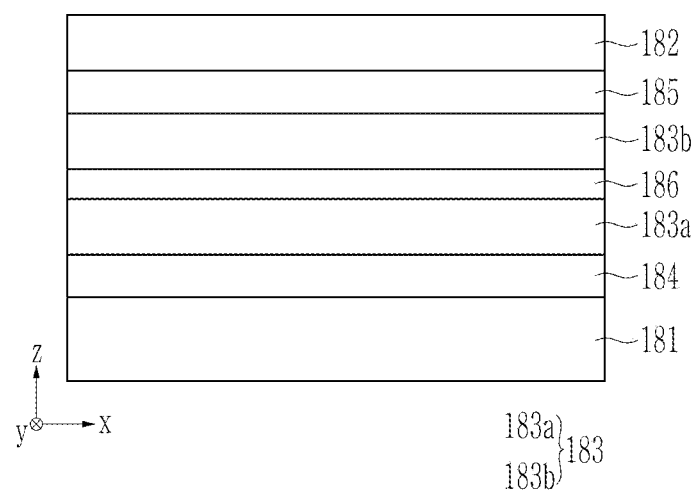

Referring to FIG. 9, the light emitting device 180 may be a light emitting device having a tandem structure, and includes a first electrode 181 and a second electrode 182 facing each other; a first light emitting layer 183*a* and a second light emitting layer 183*b* between the first electrode 181 and the second electrode 182; a charge generation layer 186 between the first light emitting layer 183*a* and the second light emitting layer 183*b*, and optionally auxiliary layers 184 and 185 between the first electrode 181 and the first light emitting layer 183*a* and between the second electrode 182 and the second light emitting layer 183*b*.

The first electrode 181, the second electrode 182, and the auxiliary layers 184 and 185 are as described above.

The first light emitting layer 183*a* and the second light emitting layer 183*b* may emit light having the same or different emission spectrum, and, for example, each may emit light having a blue emission spectrum. Detailed descriptions are the same as the light emitting layer 183 described above.

The charge generation layer 186 may inject electric charges into the first light emitting layer 183*a* and/or the second light emitting layer 183*b*, and may control a charge balance between the first light emitting layer 183*a* and the second light emitting layer 183*b*. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Figure 10:
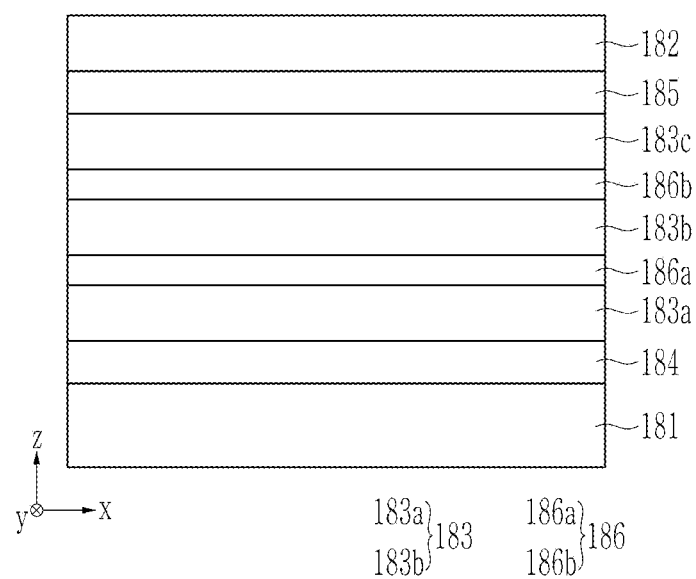

Referring to FIG. 10, the light emitting device 180 may be a light emitting device having a tandem structure, and includes a first electrode 181 and a second electrode 182 facing each other; a first light emitting layer 183*a*, a second light emitting layer 183*b*, and a third light emitting layer 183*c* between the first electrode 181 and the second electrode 182; a first charge generation layer 186*a* between the first light emitting layer 183*a* and the second light emitting layer 183*b*; a second charge generation layer 186*b* between the second light emitting layer 183*b* and the third light emitting layer 183*c*; and optionally, auxiliary layers 184 and 185 between the first electrode 181 and the first light emitting layer 183*a* and between the second electrode 182 and the third light emitting layer 183*c*.

The first electrode 181, the second electrode 182, and the auxiliary layers 184 and 185 are as described above.

The first light emitting layer 183*a*, the second light emitting layer 183*b*, and the third light emitting layer 183*c* may emit light having the same or different emission spectrum, and, for example, each may emit light having a blue emission spectrum. Detailed descriptions are the same as the light emitting layer 183 described above.

The first charge generation layer 186*a* may inject electric charges into the first light emitting layer 183*a* and/or the second light emitting layer 183*b*, and may control charge balances between the first light emitting layer 183*a* and the second light emitting layer 183*b*. The second charge generation layer 186*a* may inject electric charges into the second light emitting layer 183*b* and/or the third light emitting layer 183*c*, and may control charge balances between the second light emitting layer 183*b* and the third light emitting layer 183*c*. Each of the first and second charge generation layers 186*a* and 186*b* may be one layer or two or more layers.

Figure 11:
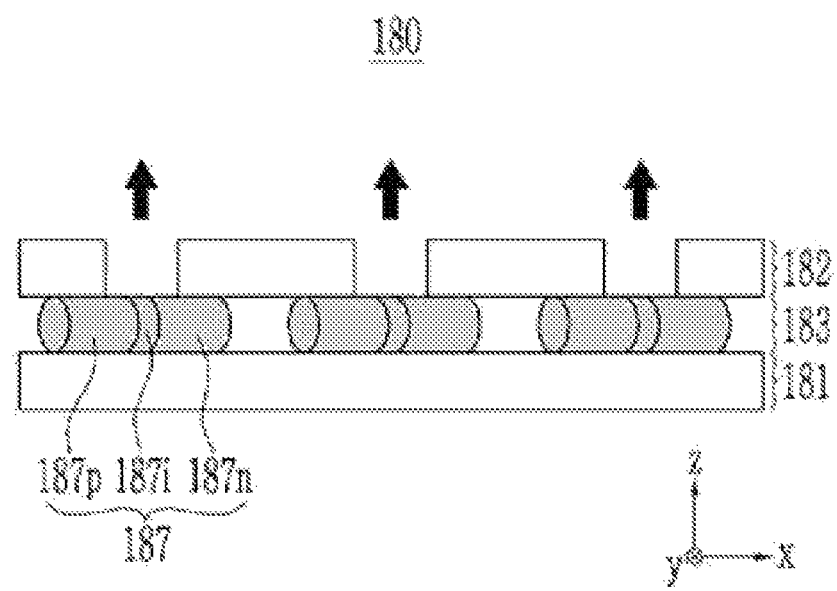

Referring to FIG. 11, the light emitting element 180 includes a light emitting layer 183 including a first electrode 181, a second electrode 182, and a plurality of nanostructures 187.

One of the first electrode 181 and the second electrode 182 may be an anode and the other may be a cathode. The first electrode 181 and the second electrode 182 may be electrodes patterned according to arrangement directions of the plurality of nanostructures 187, and may include, for example, conductive oxides such as indium tin oxide (ITO), indium zinc oxide (IZO), zinc oxide (ZnO), tin oxide (SnO), aluminum tin oxide (AITO), and fluorine-doped tin oxide (FTO); silver (Ag), copper (Cu), aluminum (Al), gold (Au), titanium (Ti), chromium (Cr), nickel (Ni), an alloy thereof, a nitride thereof (e.g., TiN); or a combination thereof, but are not limited thereto.

The light emitting layer 183 may include a plurality of nanostructures 187, and each of the subpixels $PX_1$, $PX_2$, and $PX_3$ may include a plurality of nanostructures 187. The plurality of nanostructures 187 may be arranged along one direction, but the present disclosure is not limited thereto. The nanostructures 187 may be a compound semiconductor configured to emit light of a predetermined wavelength when an electric current is applied, and may be, for example, linear nanostructures such as nanorods or nanoneedles. The diameter or long diameter of the nanostructures 187 may be, for example, several to several hundreds of nanometers, and aspect ratios of the nanostructures 187 may be in the range of greater than about 1, greater than or equal to about 1.5, greater than or equal to about 2.0, greater than or equal to about 3.0, greater than or equal to about 4.0, greater than or equal to about 4.5, greater than or equal to about 5.0, greater than about 1 and less than or equal to about 20, about 1.5 to about 20, about 2.0 to about 20, about 3.0 to about 20, about 4.0 to about 20, about 4.5 to about 20, or about 5.0 to about 20, or a combination thereof.

Each of the nanostructures 187 may include a p-type region 187*p*, an n-type region 187*n*, and a multiple quantum well region 187*i*, and may be configured to emit light from the multiple quantum well region 187*i*. The nanostructures 187 may include, for example, gallium nitride (GaN), indium gallium nitride (InGaN), aluminum gallium nitride (AlGaN), or a combination thereof, and may have, for example, a core-shell structure.

The plurality of nanostructures 187 may emit light having the same or different emission spectra. In an embodiment, the first nanostructure 187*a* may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm.

In an embodiment, the light emitting element 180 may be a micro light emitting diode (hereinafter, referred to as μLED). Herein, a pitch between adjacent light emitting elements, that is, a distance between each center of two neighboring light emitting elements may be less than or equal to about 100 micrometers.

In an embodiment, light emitted from the light emitting element 180 may have a central wavelength of about 430 nm to about 470 nm, for example, about 440 nm to about 460 nm but is not limited thereto.

A plurality of the light emitting elements 180 may be electrically connected one another. For example, the plurality of light emitting elements displaying the same color in a subpixel may be electrically connected one another. A color displayed in each subpixel $PX_1$, $PX_2$, and $PX_3$ is different from light having a specific emission spectrum emitted from each light emitting element 180 is converted into light having a different specific emission spectrum in each color conversion layer on the light emitting element 180. Accordingly, the plurality of light emitting elements under the color conversion layers converting light emitted from each light emitting element 180 into light having the same specific emission spectra may be electrically connected one another. For example, the light emitting elements under the second color conversion region converting blue light emitted from the plurality of light emitting element 180 into red light may be electrically connected one another. In addition, for example, the plurality of light emitting element under the first color conversion region converting blue light emitted from the plurality of light emitting element 180 into green light may be electrically connected one another. Furthermore, the light emitting elements under the light transmitting region not converting blue light emitted from the plurality of light emitting element into light of different wavelengths but transmitting it may be electrically connected one another. According to these connections, the light emitting elements located in the region emitting light of the same color may be simultaneously driven.

Hereinafter, the embodiments are illustrated in more detail with reference to examples. However, they are exemplary examples of the present disclosure, and the present disclosure is not limited thereto.

EXAMPLES

Analysis Methods

[1] UV-Vis Spectroscopy

UV spectroscopy is performed by using an Agilent Cary5000 spectrometer to obtain a UV-Visible absorption spectrum.

[2] Photoluminescence Analysis

A photoluminescence (PL) spectrum of the produced quantum dots at an excitation wavelength of 450 nm is obtained using a Hitachi F-7000 spectrophotometer.

[3] ICP Analysis

Inductively coupled plasma atomic emission spectroscopy (ICP-AES) is performed using a Shimadzu ICPS-8100.

[4] Blue Light Absorption Rate for Composites

An amount (B) of incident light of a wavelength of 450 nm is measured by using an integrating hemisphere of an absolute quantum efficiency-measuring device (QE-2100, Otsuka Electronics Co., Ltd.). Subsequently, a quantum dot composite is added to the integrating hemisphere, and the composite is irradiated with the incident light to measure an amount (A) of first light emitted from the composite, and an amount (B) of incident light passing through the composite.

The measured amounts are used to calculate an incident light absorption rate according to the following equation.

$$\text{Blue light absorption rate (\%)} = [(B-B')/B] \times 100$$

[5] Measurement of Optical Density 10 microliters (μl) of quantum dots is diluted in 990 μl of toluene and put in a 1 ml cuvette having a 1 cm optical path and then, measured with respect to optical density in a wavelength region of 300 nm to 700 nm by using UV-Vis absorption spectroscopy (UV-2600, Shimadzu Corp.).

Synthesis Example 1: Preparation of Green Light Emitting AIGS-Based Quantum Dots Silver acetate is dissolved in oleyl amine to prepare a 0.06 M silver precursor-containing solution (hereinafter, referred to as 'silver precursor'). A 1 molar (M) sulfur precursor-containing solution (hereinafter, referred to as 'sulfur precursor') is prepared by dispersing sulfur in oleyl amine. A 1 M indium precursor-containing solution (hereinafter, referred to as 'indium precursor') is prepared by dispersing indium chloride in ethanol. A 4.5 M gallium precursor-containing solution (hereinafter, referred to as 'gallium precursor') is prepared by dissolving gallium chloride in toluene.

(1) In a 100 mL reaction flask, gallium acetylacetonate, octadecene (ODE), and dodecanethiol are added and then heated at 120° C. under vacuum for 10 minutes. The flask is cooled to room temperature and nitrogen gas is added The silver precursor, the sulfur precursor, and the indium precursor are added to the flask, the flask is heated to a temperature of 210° C. and the temperature maintained for 60 minutes. The temperature of the flask is reduced to 180° C., and trioctylphosphine (TOP) is added and then the flask allowed to cool to room temperature. Subsequently, hexane and ethanol are added to the flask to promote precipitation. The resulting precipitate is separated through centrifugation. The indium precursor, gallium precursor, and sulfur precursor are added in a mole ratio of In:Ga:S of 1:2.3:4.8, and moles of the silver precursor to those of the indium precursor are added in range of 0.5 to 1.2 times of silver to indium.

(2) Dimethylthiourea (DMTU), oleylamine, and dodecanethiol are added to a flask, and vacuum-treated at 120° C. for 10 minutes. Nitrogen gas is introduced into the flask and the flask heated to 240° C. (first temperature). The precipitate obtained from (1) above and the prepared gallium precursor are added to the flask. The reactor is heated to 280° C. (second temperature), and the mixture is reacted for 30 minutes (first time period). The temperature of the reaction flask is reduced to 180° C. and after adding trioctylphosphine the reaction mixture is allowed to cool to room temperature. Hexane and ethanol are added to the flask to promote the formation of semiconductor nanocrystals, which are then recovered by centrifugation and redispersed in toluene. The gallium precursor and the sulfur precursor are added in a mole ratio of 1.1:1.

(3) Zinc chlorides are dissolved in trioctylphosphine (TOP) to prepare a 0.5 M zinc precursor-containing solution (hereinafter, 'zinc precursor'). A 0.4 M sulfur precursor-containing solution (hereinafter, referred to as 'sulfur precursor') is prepared by dissolving dimethyl thiourea (DMTU) in oleylamine.

In a 100 ml flask, oleylamine is added and vacuum-treated at 120° C. for 10 minutes. Nitrogen gas is introduced into the flask and the flask heated to 200° C. The semiconductor nanocrystals prepared in (2) are injected into the flask, followed by continuous addition of the zinc precursor and the sulfur precursor prepared above over a 10 minute period. The reaction mixture is heated at 200° C. for 40 minutes, and after the reaction mixture is cooled to 180° C. trioctylphosphine is added. The reaction mixture in allowed to cool to room temperature. Hexane and ethanol are added to promote the formation of semiconductor nanocrystals, which are then separated (recovered) by centrifugation and redispersed in toluene. The zinc precursor and the sulfur precursor are used in a mole ratio of 1.2:1.

The obtained semiconductor nanocrystals are analyzed by ICP-AES, and the results are shown in Tables 1A and 1B. The ratio of elements provided in Tables 1A and 1B is a molar ratio.

TABLE 1A

| | ICP-AES Analysis (mole ratio) | | | |
|---|---|---|---|---|
| | Ag:S | In:S | Ga:S | Zn:S |
| Ex. 1 | 0.24:1 | 0.05:1 | 0.34:1 | 0.3:1 |

TABLE 1B

| | ICP-AES Analysis (mole ratio) | | | |
|---|---|---|---|---|
| | Zn:(Ag + In + Ga + Zn) | Ga:(In + Ga) | (In + Ga):Ag | S:(Ag + In + Ga + Zn) |
| Ex. 1 | 0.32:1 | 0.87:1 | 1.6:1 | 1.08:1 |

Figure 12:
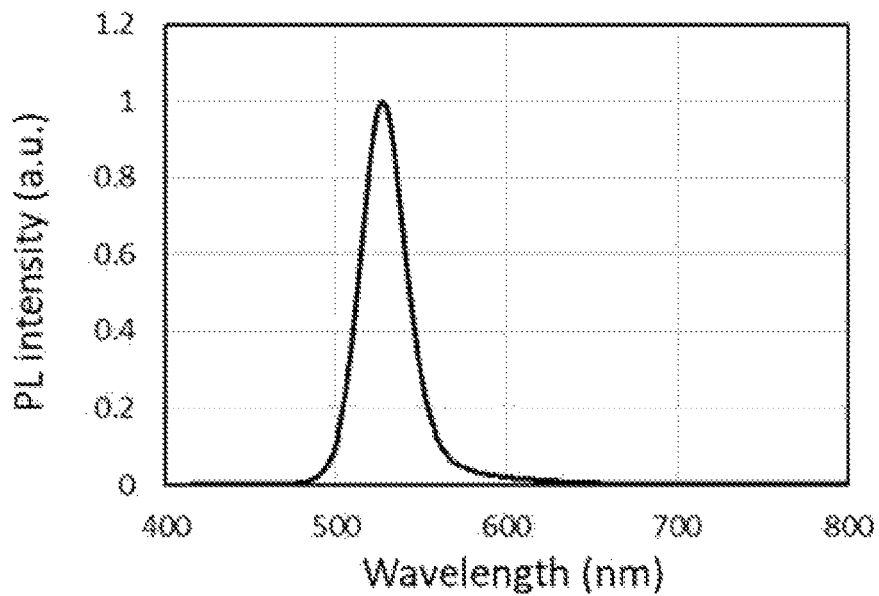
FIG. 12 shows emission spectrums of the quantum dots prepared in Synthesis Example 1.

A photoluminescence analysis is performed on the obtained semiconductor nanocrystals, and the results are shown in Table 2 and FIG. 12. Referring to the results of FIG. 12, relative band-edge luminance intensity defined according to the following formula is confirmed to be about 60.

Relative band-edge luminance intensity=$A1/A2$

A1: Intensity of the maximum emission peak
A2: maximum intensity at a wavelength from a maximum emission peak wavelength plus from 80 nm to 120 nm.

TABLE 2

| | Emission peak wavelength (nm) | Full width at half maximum (FWHM) (nm) | Quantum yield (QY) |
|---|---|---|---|
| Example 1 | 527 | 31 | 80% |

In addition, the obtained semiconductor nanocrystals are measured with respect to optical density (OD) per weight by adding a solution of the prepared semiconductor nanocrystals in a cuvette with an optical path of 1 cm in a UV-Vis absorption spectroscopic (UV-2600, Shimadzu Corp.) device to measure OD according to a wavelength and then calculating the weight of the nanocrystals after evaporating the solvent of the measured solution to calculate OD per weight. The OD of the Synthesis Example 1 semiconductor nanocrystals is 1.48 per 1 mg.

Synthesis Example 2: Preparation of Green Light Emitting InP/ZnSe/ZnS Quantum Dots (1) Synthesis of InP Core In a 200 mL reaction flask, indium acetate and palmitic acid are dissolved in 1-octadecene and then, heated at 120° C. under vacuum. Herein, a mole ratio of indium to palmitic acid is about 1:3. After 1 hour nitrogen gas is introduced into the flask, the flask is heated to 280° C., and a mixed solution of tris(trimethylsilyl)phosphine (TMS3P) and trioctylphosphine is rapidly injected into the flask. The reaction is allowed to proceed for 20 minutes at 280° C. The flask (reaction solution) is cooled to room temperature and acetone is added to promote formation of a precipitate that is then separated through centrifugation and dispersed in toluene. Herein, TMS3P is used in an amount of 0.5 moles per 1 mole of indium. A size of the obtained InP core is about 2 nm.

(2) Preparation of InP/ZnSe/ZnS Quantum Dots

Selenium is dispersed in trioctylphosphine to prepare a Se/TOP stock solution, and sulfur is dispersed in trioctylphosphine to prepare an S/TOP stock solution.

In a 200 mL reaction flask, zinc acetate and oleic acid are dissolved in trioctylamine and then, vacuum-treated at 120° C. for 10 minutes. Nitrogen gas is introduced into the reaction flask and the toluene dispersion of the synthesized InP core from (1) is injected into the flask as the temperature of the reaction flask is raised to 320° C. The prepared Se/TOP stock solution is injected into the flask using several small additions over time. The reaction provides particles having a ZnSe shell disposed on the core. A total reaction time is approximately 100 minutes, and about 23 moles of Se is used per 1 mole of indium.

At a reaction temperature of 320° C., the prepared S/TOP stock solution is injected into the reaction solution including the core-shell particles. The reaction is performed to obtain a reaction solution including particles in which an outer ZnS shell is disposed on the inner ZnSe shell. The total reaction time is 60 minutes, and about 13 moles of sulfur is used for 1 mole of indium. Thereafter, the solution is cooled to room temperature, an excess of ethanol is added to promote formation of a precipitate that is then separated through centrifugation. The precipitate is dried and dispersed in toluene to obtain an InP/ZnSe/ZnS quantum dot solution (dispersion).

Synthesis Example 3: Preparation of Green Light Emitting InP/ZnSeS Quantum Dots (1) Synthesis of InP Core In a 200 mL reaction flask, indium acetate and palmitic acid are dissolved in 1-octadecene and heated at 120° C. under vacuum. The mole ratio of indium and palmitic acid is about 1:3. After 1 hour nitrogen gas is introduced into the flask. After heating the flask to 280° C., a mixed solution of tris(trimethylsilyl)phosphine (TMS3P) and trioctylphosphine is rapidly injected into the flask, and the reaction temperature is maintained for about 20 minutes. The flask (reaction solution) is cooled to room temperature and acetone is added to promote formation of a precipitate that is then separated through centrifugation and dispersed in toluene. Herein, TMS3P is used in an amount of 0.5 moles per 1 mole of indium. A size of the obtained InP core is about 2 nm.

(2) Preparation of InP/ZnSeS Quantum Dots

Selenium is dispersed in trioctylphosphine to prepare a Se/TOP stock solution, and sulfur is dispersed in trioctylphosphine to prepare an S/TOP stock solution.

In a 200 mL reaction flask, zinc acetate and oleic acid are dissolved in trioctylamine and then, vacuum-treated at 120° C. for 10 minutes. Nitrogen gas is introduced into the reaction flask and the toluene dispersion of the synthesized InP core (1) is injected into the flask as the temperature of the reaction flask is raised to 280° C. The prepared Se/TOP stock solution and dodecanethiol are injected into the reaction flask using several portions over a period of time as the reaction temperature is maintained at 280° C. to provide particles including ZnSeS shells disposed on the InP core. A total reaction time is approximately 30 minutes, and about 5 moles of selenium is used per 1 mole of indium, and a content of dodecanethiol (DDT) is 10 moles. Thereafter, the solution is cooled to room temperature, an excess of ethanol is added to promote formation of a precipitate, which is then separated through centrifugation. The precipitate is dried and dispersed in toluene to obtain an InP/ZnSeS quantum dot solution (dispersion).

Synthesis Example 4: Preparation of Red Light Emitting InP-Based Quantum Dots

In a 200 mL reaction flask, indium acetate and palmitic acid are dissolved in 1-octadecene and then, heated at 120° C. under vacuum for 1 hour. Herein, a mole ratio of indium and palmitic acid is about 1:3. Nitrogen gas is introduced into the reaction flask. The reactor is heated to a temperature of 280° C., a mixed solution of tris(trimethylsilyl)phosphine (TMS3P) and trioctylphosphine is rapidly injected into the flask, and the reaction allowed to proceed for 20 minutes. The flask (reaction solution) is cooled to room temperature and acetone is added to promote formation of a precipitate that is then separated through centrifugation and dispersed in toluene. Herein, TMS3P is used in an amount of 0.75 moles per 1 mole of indium. A size of the obtained InP core is about 3.6 nm.

Selenium is dispersed in trioctylphosphine to prepare a Se/TOP stock solution, and sulfur is dispersed in trioctylphosphine to prepare an S/TOP stock solution.

In a 200 mL reaction flask, zinc acetate and oleic acid are dissolved in trioctylamine and then, vacuum-treated at 120° C. for 10 minutes. Nitrogen gas is introduced into the reaction flask and the toluene dispersion of the synthesized InP core is injected into the flask as the temperature of the reaction flask is raised to 320° C. The prepared Se/TOP stock solution is injected using several portions over time as the reaction temperature is maintained at 320° C. to obtain particles in which a ZnSe shell is disposed on an InP core. A total reaction time is approximately 100 minutes, and about 7 moles of selenium is used for 1 mole of indium.

Then, at the reaction temperature of 320° C., the prepared S/TOP stock solution is injected into the reaction solution. The reaction is performed to obtain particles in which the ZnS shell is disposed on the ZnSe shell. The total reaction time is 60 minutes, and about 5 moles of sulfur is used for 1 mole of indium. Thereafter, the solution is cooled to room temperature, an excess of ethanol is added to promote the formation of a precipitate, which is then separated through centrifugation. The precipitate is dried and dispersed in toluene to obtain an InP/ZnSe/ZnS quantum dot solution.

Examples 1 to 5 and Comparative Examples 1 to 3: Preparation and Characteristic Analysis of Green Light Emitting Quantum Dot-Polymer Composites (1) Preparation of Quantum Dot-Binder Dispersion After separating the quantum dots from the toluene dispersion of the quantum dots prepared in Synthesis Examples 1 to 3 by centrifugation, the respective quantum dots are dispersed in chloroform. The quantum dot chloroform dispersions are mixed with a binder (a quaternary copolymer of methacrylic acid, benzyl methacrylate, hydroxyethyl methacrylate, and styrene, an acid value: 130 mg KOH/g, a molecular weight: 8000) solution (30 wt % of PGMEA (propylene glycol monomethyl ether acetate)), to prepare a quantum dot-binder dispersion.

(2) Preparation of Photosensitive Composition

The quantum dot-binder dispersion is mixed with hexaacrylate, glycoldi-3-mercaptopropionate (hereinafter, 2T) having the structure below as a photopolymerizable monomer, an oxime ester compound as an initiator, and TiO₂ nanoparticles as a light diffusing agent, and PGMEA as a solvent to prepare a composition.

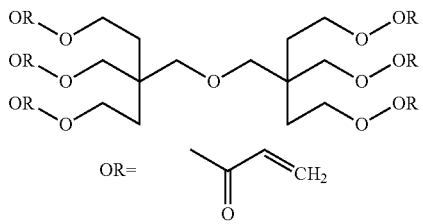

The prepared composition includes, based on a total weight of the solid, quantum dots and TiO₂ particles as shown in Table 3, 0.5 wt % of the initiator, 25 wt % of the 2T, and the rest of a binder included in the quantum dot-binder dispersion, so that the total solid content (TSC) of this composition may be 25 wt %.

(3) Preparation and Characteristic Analysis of Green Light Emitting Quantum Dot-Polymer Composite Film Each of the photosensitive compositions according to Examples 1 to 5 and Comparative Examples 1 to 3 obtained in (2) is spin-coated on a glass substrate at 150 rpm for 5 seconds to obtain each film. The obtained films are prebaked (PRB) at 100° C. for 2 minutes. The prebaked films are irradiated with light (wavelength: 365 nm and intensity: 100 mJ) for 1 second under a mask having a predetermined pattern (e.g., square dot or stripe pattern), and post-baking (POB) at 180° C. for 30 minutes. Then, the films are developed with an aqueous potassium hydroxide solution (concentration: 0.043%) for 50 seconds, patterned green light emitting quantum dot-polymer composite films (e.g., green QD CF film) having a thickness of about 10 μm are obtained.

For each of the films an emission spectrum (photoluminescence: PL) for an excitation wavelength of 450 nm is obtained using a Hitachi F-7000 spectrometer, and an emission peak wavelength and full width at half maximum (FWHM) are measured. In addition, using the Otsuka QE-2100 quantum efficiency measuring system (manufacturer: Otsuka Electronics Co., Ltd.), blue light absorption rate of each film is measured. The measured results are shown in Table 3.

In addition, in order to measure a content of each element in the green light emitting quantum dot-polymer composite film, the film is dissolved in nitric acid, bromic acid, or hydrofluoric acid to obtain a solution, and an ICP-AES analysis is performed. The ICP-AES analysis is used to determine the mole ratio of each of silver and gallium to the moles of titanium in the composite film. The mole ratios are listed in Table 3.

TABLE 3

| | Content of quantum dots (wt %) | Content of TiO₂ particles (wt %) | Mole ratio in the green light emitting quantum dot composite film | | Optical properties of green light emitting quantum dot composite film (10 μm) for 450 nm excitation light | | |
|---|---|---|---|---|---|---|---|
| | | | Ag:Ti | Ga:Ti | peak wavelength (nm) | FWHM (nm) | absorption rate (%) |
| Ex. 1 | 20 | 4.8 | 1.1:1 | 1.6:1 | 536 | 30 | 96 |
| Ex. 2 | 37 | 4.8 | 2.0:1 | 2.5:1 | 540 | 31 | 98 |
| Ex. 3 | 41 | 4 | 2.5:1 | 3.4:1 | 542 | 33 | 100 |
| Ex. 4 | 30 | 0.5 | 15:1 | 19:1 | 534 | 30 | 89 |
| Ex. 5 | 10 | 6 | 0.42:1 | 0.56:1 | 535 | 34 | 92 |
| Comp. Ex. 1 | 40 | 0.1 | 95:1 | 110:1 | 532 | 30 | 80 |
| Comp. Ex. 2 | 41 | 4 | 0 | 0 | 536 | 34 | 85 |
| Comp. Ex. 3 | 41 | 4 | 0 | 0 | 535 | 39 | 84 |

Referring to Table 3, each film of the green light emitting quantum dot composites of Examples 1 to 5 exhibits a mole ratio of silver to titanium (Ag:Ti) in a range of greater than or equal to about 0.4 and less than or equal to about 20, a mole ratio of gallium to titanium (Ga:Ti) in a range of greater than or equal to about 0.4 and less than or equal to about 20, and a very high absorption rate of blue light of at least 89%. In addition, these films emit green light with a relatively long emission peak wavelength between about 530 nm to 540 nm with an excitation wavelength of 450 nm a full width at half maximum (FWHM) of the emission peak in a range of less than 35 nm, which confirm excellent light emitting characteristics.

In contrast, a composite film made of the quantum dot composite including titanium dioxide particles in a very low content 0.1 wt % according to Comparative Example 1 and a mole ratio of silver to titanium of 95:1, and also, a mole ratio of gallium to titanium of 110:1. Moreover, the composite film of Comparative Example 1 exhibits an emission peak wavelength of 532 nm (a shorter green light) and a very low full width at half maximum (FWHM) of 30 nm. However, the blue light absorption rate is only 80%, which is a significantly low absorption rate, compared with the quantum dot composite films according to Examples 1 to 5.

In addition, as for the green light emitting quantum dot composite films manufactured by using conventional InP-based quantum dots rather than AIGS-based quantum dots according to Comparative Examples 2 and 3, each composite thereof has the same quantum dot content (41 wt %) and the same titanium dioxide content (4 wt %) as those of Example 3. The composite including the InP-based quantum dots of Comparative Examples 2 and 3 do not include silver and gallium, and have a blue light absorption rate of 85% and 84%, which again, is lower than Examples 1 to 5. The quantum dot composite film having a blue light absorption rate of 85% very seriously deteriorates luminous properties of a display panel including, and therefore, are unsuitable as a commercial display. The composite films of Comparative Examples 2 and 3 exhibit emission peak wavelengths of 536 nm and 535 nm, respectively, with respect to excitation light of 450 nm, and a full width at half maximum (FWHM) of 34 nm and 39 nm, respectively. Accordingly, the composite film of Comparative Example 3 exhibits inferior light emitting characteristics to that of Comparative Example 2.

Preparation Example: Manufacture of Display Panel (1) Preparation of a Red Light Emitting Quantum Dot-Polymer Composite A red light emitting quantum dot-polymer composite is manufactured in the same manner as in Examples 1 to 5 by using the red light emitting quantum dots according to Synthesis Example 4 to fabricate a color conversion layer of a display panel including a green light emitting region, a red light emitting region, and a blue light emitting region. In other words, a photosensitive resin composition for manufacturing the red light emitting quantum dot-polymer composite is prepared in the same manner as above except that the InP-based red light emitting quantum dots according to Synthesis Example 4 are used as the quantum dots. The content of the quantum dots is about 36 wt %, and titanium dioxide particles are used in a content of 4 wt %. The composition for manufacturing the red light emitting quantum dot-polymer composite is as described below. The composition is applied and cured to provide a region corresponding to a red light emitting pixel of a display panel.

(2) Preparation of Transparent Matrix for Light Transmitting Region

In order to form a light transmitting region configured to transmit blue light, which is the excitation light for a display panel, a transparent matrix composition does not include quantum dots, but does include the titanium dioxide particles in an amount of 5 wt % based on a total weight of the solid, is prepared. The transparent matrix composition is prepared in the same manner as in the quantum dot-polymer composites of Examples 1 to 5, but does not include quantum dots. The light transmitting region is applied and cured to provide a region corresponding to the light transmitting region of a display panel.

(3) Preparation of a Color Conversion Layer Including a Green Light Emitting Region, a Red Light Emitting Region, and a Blue Light Emitting Region (Light Transmitting Region)

Each composition for a green light emitting quantum dot-polymer composite according to Examples 1 to 5 is applied with the composition for a red light emitting quantum dot-polymer composite and the transparent matrix composition for a light transmitting region, and thus, corresponding to a green pixel, a red pixel of each color conversion layer, for the manufacturing of a display panel.

Herein, in each display panel, the green pixel, the red pixel, and the light transmitting (blue) region all have the same area ratio. In each display panel manufactured as described above, the mole ratios of silver to titanium and gallium to titanium included in the entire display panel is determined by ICP-AES, and the results are shown in Table 4.

TABLE 4

| | Content of quantum dots (wt %) | Content of TiO$_2$ particles (wt %) | Mole ratio in a color conversion layer of a display panel including a green light emitting pixel, a red light emitting pixel, and a blue light emitting pixel | |
|---|---|---|---|---|
| | | | Ag:Ti | Ga:Ti |
| Ex. 1 | 20 | 4.8 | 0.31:1 | 0.33:1 |
| Ex. 2 | 37 | 4.8 | 0.59:1 | 0.54:1 |
| Ex. 3 | 41 | 4 | 0.71:1 | 0.75:1 |
| Ex. 4 | 30 | 0.5 | 0.64:1 | 0.81:1 |
| Ex. 5 | 10 | 6 | 0.15:1 | 0.19:1 |
| Comp. Ex. 1 | 40 | 0.1 | 0.78:1 | 0.95:1 |
| Comp. Ex. 2 | 41 | 4 | 0 | 0 |
| Comp. Ex. 3 | 41 | 4 | 0 | 0 |

Referring to Table 4, in the display panels according to Examples 1 to 5, mole ratio of Ag to Ti (Ag:Ti) is greater than or equal to about 0.1:1 and less than or equal to about 1:1, and a mole ratio of Ga to Ti (Ga:Ti) is greater than or equal to about 0.1:1 and less than or equal to about 1:1.

In contrast, the green light emitting quantum dot-composite of Comparative Example 1 including titanium particles in a relatively low content of 0.1 wt %, but includes the same content of titanium dioxide particles in the red light emitting quantum dot-composite and a transparent matrix forming a light transmitting region as in Examples 1 to 5. The mole ratio of Ag to Ti in the display panel is less than 1, and in addition, the mole ratio of Ga to Ti elements is less than 1.

In addition, when the green light emitting quantum dots are InP-based quantum dots, but do not include Ag and Ga, the mole ratio of silver to Ti or the mole ratio of Ga to Ti are in each instance zero.

The display panels of Comparative Examples 1 to 3, as shown in Table 3, exhibit a lower blue light absorption rate of a green light emitting color conversion region than those of Examples 1 to 5. Although the red light emitting color conversion regions of Comparative Examples 1 to 3 use the same red light emitting quantum dots as Examples 1 to 5, and the light transmitting regions of Comparative Examples 1 to 3 are formed of the same matrix material as Examples 1 to 5, Comparative Examples 1 to 3 exhibit a lower blue light absorption rate over the entire display panel, and therefore, have deteriorated luminous properties.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display panel comprising
   a quantum dot composite comprising a matrix including a plurality of quantum dots and titanium dioxide (TiO$_2$) particles dispersed in the matrix,
   wherein the plurality of quantum dots comprise silver and gallium, and an emission peak wavelength of the quantum dots is from about 500 nm to about 550 nm, and a full width at half maximum (FWHM) of the emission peak is greater than or equal to about 10 nm and less than or equal to about 50 nm, wherein a mole ratio of silver to titanium in the quantum dot composite is greater than or equal to about 0.4:1 and less than or equal to about 15:1, and a mole ratio of gallium to titanium in the quantum dot composite is greater than or equal to about 0.4:1 and less than or equal to about 20:1.

2. The display panel of claim 1, wherein a content of the quantum dots is about 10 weight percent to about 40 weight percent, and a content of the titanium dioxide particles is about 0.2 weight percent to about 7 weight percent, based on the total weight of the quantum dot composite.

3. The display panel of claim 1, wherein the quantum dots further comprise sulfur and optionally indium.

4. The display panel of claim 1, wherein the quantum dots comprise a core, and a shell disposed on the core, the core comprising a semiconductor nanocrystal that comprises silver, gallium, and sulfur, and optionally indium, and the shell comprises a semiconductor nanocrystal that comprises zinc and sulfur.

5. The display panel of claim 4, wherein the core of the quantum dot comprises a semiconductor nanocrystal that comprises silver, gallium, sulfur, and indium, and a semiconductor nanocrystal that comprises silver, gallium, and sulfur.

6. The display panel of claim 1, wherein the quantum dots have an optical density of from about 0.8 to about 1.8 for a wavelength of about 450 nm per 1 mg of quantum dots.

7. The display panel of claim 1, wherein the matrix is prepared from a composition comprising a polymerizable monomer having a carbon-carbon double bond, an organic solvent, polymer, a thiol compound having at least one thiol group at the terminal end, or a combination thereof.

8. A display panel, comprising a color conversion layer comprising a plurality of regions comprising a color conversion region, wherein the color conversion region comprises a first color conversion region and a second color conversion region, wherein the first color conversion region comprises quantum dots comprising silver and gallium, and titanium dioxide particles, and the second color conversion region comprises quantum dots comprising indium and phosphorus, and titanium dioxide particles, and in the color conversion layer, a mole ratio silver to titanium is greater than or equal to about 0.1:1 and less than or equal to about 1:1, and a mole ratio of gallium to titanium is greater than or equal to about 0.1:1 and less than or equal to about 1:1.

9. The display panel of claim 8, wherein the mole ratio of silver to titanium is greater than or equal to about 0.1:1 and less than or equal to about 0.75:1, and the mole ratio of gallium to titanium is greater than or equal to about 0.15:1 and less than or equal to about 0.8:1.

10. The display panel of claim 8, wherein the mole ratio of silver to titanium is greater than or equal to about 0.15:1 and less than or equal to about 0.71:1, and the mole ratio of gallium to titanium is greater than or equal to about 0.19:1 and less than or equal to about 0.75:1.

11. The display panel of claim 8, wherein the first color conversion region has an emission peak wavelength of about 500 nm to about 550 nm, and the second color conversion region has an emission peak wavelength of about 600 nm to about 650 nm.

12. The display panel of claim 8, wherein the quantum dots and the titanium dioxide particles in each of the first color conversion region and the second color conversion region are in a form of a quantum dot composite that disperses the quantum dots and the titanium dioxide particles in a polymer matrix, wherein a content of the titanium dioxide particles in the first color conversion region is about 0.2 weight percent to about 7 weight percent based on the total weight of the composite in the first color conversion region, and a content of the titanium dioxide particles in the second color conversion region is about 0.5 weight percent to about 7 weight percent based on the total weight of the composite in the second color conversion region.

13. The display panel of claim 12, wherein the content of the titanium dioxide particles in the first color conversion region is about 0.5 weight percent to about weight percent based on the total weight of the composite in the first color conversion region, and the content of the titanium dioxide particles in the second color conversion region is about 1 weight percent to about 7 weight percent based on the total weight of the composite in the second color conversion region.

14. The display panel of claim 8, wherein the plurality of regions of the color conversion layer comprises a transparent matrix and a light transmitting region comprising titanium dioxide particles dispersed in the transparent matrix.

15. The display panel of claim 14, wherein a content of the titanium dioxide particles is about 1 weight percent to about 10 weight percent based on the total weight of the transparent matrix and the titanium dioxide particles in the light transmitting region.

16. The display panel of claim 8, wherein quantum dots included in the first color conversion region comprise a core and a shell disposed on the core, the core comprises a semiconductor nanocrystal that comprises silver, gallium, and sulfur, and optionally indium, and the shell comprises a semiconductor nanocrystal that comprises zinc and sulfur, wherein the quantum dots included in the second color conversion region comprise a core and a shell disposed on the core, the core comprises a semiconductor nanocrystal that comprises indium and phosphorus, and optionally zinc, and the shell comprises a semiconductor nanocrystal that comprises zinc and at least one of sulfur or selenium.

17. The display panel of claim 8, wherein the display panel further comprises a light emitting panel comprising a light emitting source configured to emit blue light, a light emitting source configured to emit green light, or a combination thereof.

18. The display panel of claim 17, wherein the light emitting source comprises an organic light emitting diode, a micro LED, a mini LED, an LED comprising a nanorod, or a combination thereof.

19. The display panel of claim 17, wherein the light emitting panel comprises a light emitting source configured to emit blue light and an absorption rate of a color conversion region for the blue light is greater than or equal to about 85%.

20. An electronic device comprising the display panel of claim 1.

* * * * *